(12) United States Patent
Guterman et al.

(10) Patent No.: US 7,898,868 B2
(45) Date of Patent: Mar. 1, 2011

(54) MULTI-STATE MEMORY

(75) Inventors: Daniel C. Guterman, Fremont, CA (US); Yupin Kawing Fong, Fremont, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 12/499,581

(22) Filed: Jul. 8, 2009

(65) Prior Publication Data

US 2009/0268518 A1 Oct. 29, 2009

Related U.S. Application Data

(60) Continuation of application No. 12/110,489, filed on Apr. 28, 2008, now Pat. No. 7,573,740, which is a division of application No. 11/243,344, filed on Oct. 3, 2005, now Pat. No. 7,385,843, which is a division of application No. 10/410,672, filed on Apr. 8, 2003, which is a continuation of application No. 10/013,592, filed on Nov. 13, 2001, now Pat. No. 6,856,546, which is a continuation of application No. 09/688,061, filed on Oct. 13, 2000, now Pat. No. 6,317,364, which is a division of application No. 08/910,947, filed on Aug. 7, 1997, now Pat. No. 6,222,762.

(51) Int. Cl.
*G11C 16/06* (2006.01)

(52) U.S. Cl. ............... 365/185.21; 365/185.03; 365/185.18; 365/185.2; 365/185.22; 365/185.24

(58) Field of Classification Search ............ 365/185.21, 365/185.03, 185.18, 185.2, 185.22, 185.24
See application file for complete search history.

(56) References Cited

U.S. PATENT DOCUMENTS

| 3,906,200 A | 9/1975 | Petschauer |
| 3,992,702 A | 11/1976 | Bailey |
| 3,999,051 A | 12/1976 | Petschauer |

(Continued)

FOREIGN PATENT DOCUMENTS

EP     0373830    6/1990

(Continued)

OTHER PUBLICATIONS

K. Naruke et al.,."A New Flash-Erase EEPROM Cell with A Sidewall Select-Gate on Its Source Side", IEDM 89-603, IEEE (1989), pp. 603-606.

(Continued)

*Primary Examiner*—Viet Q Nguyen
(74) *Attorney, Agent, or Firm*—Davis Wright Tremaine LLP

(57) ABSTRACT

Maximized multi-state compaction and more tolerance in memory state behavior is achieved through a flexible, self-consistent and self-adapting mode of detection, covering a wide dynamic range. For high density multi-state encoding, this approach borders on full analog treatment, dictating analog techniques including A to D type conversion to reconstruct and process the data. In accordance with the teachings of this invention, the memory array is read with high fidelity, not to provide actual final digital data, but rather to provide raw data accurately reflecting the analog storage state, which information is sent to a memory controller for analysis and detection of the actual final digital data.

9 Claims, 21 Drawing Sheets

U.S. PATENT DOCUMENTS

| | | | |
|---|---|---|---|
| 4,074,304 A | 2/1978 | Shiba | |
| 4,151,020 A | 4/1979 | McElroy | |
| 4,151,021 A | 4/1979 | McElroy | |
| 4,184,207 A | 1/1980 | McElroy | |
| 4,202,044 A | 5/1980 | Beilstein, Jr. et al. | |
| 4,209,846 A | 6/1980 | Seppa | |
| 4,255,808 A | 3/1981 | Schaber | |
| 4,271,421 A | 6/1981 | McElroy | |
| 4,302,766 A | 11/1981 | Guterman et al. | |
| 4,331,968 A | 5/1982 | Goeney, Jr. et al. | |
| 4,380,057 A | 4/1983 | Kotecha et al. | |
| 4,400,798 A | 8/1983 | Francis et al. | |
| 4,404,655 A | 9/1983 | Naiff | |
| 4,456,971 A | 6/1984 | Fukuda et al. | |
| 4,456,995 A | 6/1984 | Ryan | |
| 4,460,998 A | 7/1984 | Yamada et al. | |
| 4,462,090 A | 7/1984 | Iizuka | |
| 4,488,265 A | 12/1984 | Kotecha | |
| 4,561,004 A | 12/1985 | Kuo et al. | |
| 4,575,925 A | 3/1986 | Kanbara et al. | |
| 4,583,201 A | 4/1986 | Bertin et al. | |
| 4,616,402 A | 10/1986 | Mori | |
| 4,622,656 A | 11/1986 | Kamiya et al. | |
| 4,652,897 A | 3/1987 | Okuyama et al. | |
| RE32,401 E | 4/1987 | Beilstein, Jr. et al. | |
| 4,661,929 A | 4/1987 | Aoki et al. | |
| 4,663,827 A | 5/1987 | Nakahara | |
| 4,677,736 A | 7/1987 | Brown | |
| 4,792,924 A | 12/1988 | Rubinstein | |
| 4,794,565 A | 12/1988 | Wu et al. | |
| 4,803,529 A | 2/1989 | Masuoka | |
| 4,805,142 A | 2/1989 | Bertin et al. | |
| 4,811,285 A | 3/1989 | Walker et al. | |
| 4,811,294 A | 3/1989 | Kobayashi et al. | |
| 4,821,236 A | 4/1989 | Hayashi et al. | |
| 4,862,418 A | 8/1989 | Cuppens et al. | |
| 4,876,616 A | 10/1989 | Katsumata et al. | |
| 4,943,962 A | 7/1990 | Imamiya et al. | |
| 4,958,352 A | 9/1990 | Noguchi et al. | |
| 4,990,979 A | 2/1991 | Otto | |
| 4,997,781 A | 3/1991 | Tigelaar | |
| 5,011,787 A | 4/1991 | Jeuch | |
| 5,017,515 A | 5/1991 | Gill | |
| 5,028,553 A | 7/1991 | Esquivel et al. | |
| 5,029,130 A | 7/1991 | Yeh | |
| 5,043,940 A | 8/1991 | Harari | |
| 5,045,488 A | 9/1991 | Yeh | |
| 5,057,886 A | 10/1991 | Riemenschneider et al. | |
| 5,067,108 A | 11/1991 | Jenq | |
| 5,070,032 A | 12/1991 | Yuan et al. | |
| 5,081,054 A | 1/1992 | Wu et al. | |
| 5,081,056 A | 1/1992 | Mazzali et al. | |
| 5,095,344 A | 3/1992 | Harari | |
| 5,107,464 A | 4/1992 | Sahara et al. | |
| 5,142,496 A | 8/1992 | Van Buskirk | |
| 5,147,816 A | 9/1992 | Gill et al. | |
| 5,163,021 A | 11/1992 | Mehrotra et al. | |
| 5,164,915 A * | 11/1992 | Blyth | 360/69 |
| 5,172,338 A | 12/1992 | Mehrotra et al. | |
| 5,172,339 A | 12/1992 | Noguchi et al. | |
| 5,175,706 A | 12/1992 | Edme | |
| 5,204,841 A | 4/1993 | Chappell et al. | |
| 5,218,569 A | 6/1993 | Banks | |
| 5,225,361 A | 7/1993 | Kakiuchi et al. | |
| 5,233,610 A | 8/1993 | Nakayama et al. | |
| 5,241,494 A * | 8/1993 | Blyth et al. | 365/185.03 |
| 5,247,485 A | 9/1993 | Ide | |
| 5,264,384 A | 11/1993 | Kaya et al. | |
| 5,270,979 A | 12/1993 | Harari et al. | |
| 5,278,439 A | 1/1994 | Ma et al. | |
| 5,279,982 A | 1/1994 | Crotti | |
| 5,280,446 A | 1/1994 | Ma et al. | |
| 5,284,784 A | 2/1994 | Manley | |
| 5,293,560 A | 3/1994 | Harari | |
| 5,297,148 A | 3/1994 | Harari et al. | |
| 5,313,421 A * | 5/1994 | Guterman et al. | 365/185.15 |
| 5,315,541 A | 5/1994 | Harari et al. | |
| 5,323,355 A | 6/1994 | Kato | |
| 5,335,198 A * | 8/1994 | Van Buskirk et al. | 365/185.3 |
| 5,337,275 A | 8/1994 | Garner | |
| 5,355,347 A | 10/1994 | Cioaca | |
| 5,377,147 A | 12/1994 | Merchant et al. | |
| 5,378,643 A | 1/1995 | Ajika et al. | |
| 5,394,362 A | 2/1995 | Banks | |
| 5,394,525 A | 2/1995 | Kuwana et al. | |
| 5,396,468 A | 3/1995 | Harari et al. | |
| 5,412,600 A | 5/1995 | Nakajima | |
| 5,420,060 A | 5/1995 | Gill et al. | |
| 5,430,859 A | 7/1995 | Norman et al. | |
| 5,434,825 A | 7/1995 | Harari | |
| 5,440,505 A | 8/1995 | Fazio et al. | |
| 5,453,955 A | 9/1995 | Sakui et al. | |
| 5,461,713 A | 10/1995 | Pascucci | |
| 5,468,663 A | 11/1995 | Bertin et al. | |
| 5,491,657 A | 2/1996 | Haddad et al. | |
| 5,497,354 A | 3/1996 | Sweha et al. | |
| 5,508,958 A | 4/1996 | Fazio et al. | |
| 5,509,134 A | 4/1996 | Fandrich et al. | |
| 5,539,690 A | 7/1996 | Talreja et al. | |
| 5,541,886 A | 7/1996 | Hasbun | |
| 5,546,351 A | 8/1996 | Tanaka et al. | |
| 5,563,828 A | 10/1996 | Hasbun et al. | |
| 5,566,111 A | 10/1996 | Choi | |
| 5,583,812 A | 12/1996 | Harari | |
| 5,594,691 A | 1/1997 | Bashir | |
| 5,602,987 A | 2/1997 | Harari et al. | |
| 5,606,521 A | 2/1997 | Kuo et al. | |
| 5,629,890 A | 5/1997 | Engh | |
| 5,629,892 A | 5/1997 | Tang | |
| 5,638,320 A | 6/1997 | Wong et al. | |
| 5,640,350 A | 6/1997 | Iga | |
| 5,642,312 A | 6/1997 | Harari | |
| 5,654,918 A | 8/1997 | Hammick | |
| 5,656,840 A | 8/1997 | Yang | |
| 5,671,388 A | 9/1997 | Hasbun | |
| 5,675,537 A | 10/1997 | Bill et al. | |
| 5,687,114 A | 11/1997 | Khan | |
| 5,708,285 A | 1/1998 | Otani et al. | |
| 5,712,180 A | 1/1998 | Guterman et al. | |
| 5,712,815 A | 1/1998 | Bill et al. | |
| 5,717,632 A | 2/1998 | Richart et al. | |
| 5,721,701 A | 2/1998 | Ikebe et al. | |
| 5,740,107 A | 4/1998 | Lee | |
| 5,745,475 A | 4/1998 | Ohno et al. | |
| 5,748,533 A | 5/1998 | Dunlap et al. | |
| 5,748,546 A | 5/1998 | Bauer et al. | |
| 5,751,632 A | 5/1998 | Choi et al. | |
| 5,764,568 A | 6/1998 | Chevallier | |
| 5,768,184 A | 6/1998 | Hayashi et al. | |
| 5,768,187 A | 6/1998 | Uchino et al. | |
| 5,768,188 A | 6/1998 | Park et al. | |
| 5,768,287 A | 6/1998 | Norman et al. | |
| 5,771,346 A | 6/1998 | Norman et al. | |
| 5,774,395 A | 6/1998 | Richart et al. | |
| 5,776,810 A * | 7/1998 | Guterman et al. | 438/258 |
| 5,781,472 A | 7/1998 | Sweha et al. | |
| 5,790,453 A | 8/1998 | Chevallier | |
| 5,801,991 A | 9/1998 | Keeney et al. | |
| 5,805,500 A | 9/1998 | Campardo et al. | |
| 5,815,443 A | 9/1998 | Sweha et al. | |
| 5,818,757 A | 10/1998 | So et al. | |
| 5,828,601 A | 10/1998 | Hollmer et al. | |
| 5,828,616 A | 10/1998 | Bauer et al. | |
| 5,831,900 A | 11/1998 | Miyamoto | |

| | | |
|---|---|---|
| 5,835,420 A | 11/1998 | Lee et al. |
| 5,847,996 A * | 12/1998 | Guterman et al. ...... 365/185.28 |
| 5,867,430 A | 2/1999 | Chen et al. |
| 5,872,735 A | 2/1999 | Banks |
| 5,883,409 A | 3/1999 | Guterman et al. |
| 5,894,437 A | 4/1999 | Pellegrini |
| 5,910,915 A | 6/1999 | Guterman et al. |
| 5,910,925 A * | 6/1999 | Guterman et al. ...... 365/230.01 |
| 5,949,711 A | 9/1999 | Kazerounian |
| 5,956,742 A | 9/1999 | Fandrich et al. |
| 5,999,451 A | 12/1999 | Lin et al. |
| 6,002,152 A | 12/1999 | Guterman et al. |
| 6,009,015 A | 12/1999 | Sugiyama |
| 6,034,891 A | 3/2000 | Norman |
| 6,038,166 A | 3/2000 | Wong |
| 6,049,899 A | 4/2000 | Auclair et al. |
| 6,127,843 A | 10/2000 | Agrawal et al. |
| 6,134,143 A | 10/2000 | Norman |
| 6,163,479 A | 12/2000 | Chevallier |
| 6,222,762 B1 * | 4/2001 | Guterman et al. ...... 365/185.03 |
| 6,285,594 B1 | 9/2001 | Bill et al. |
| 6,285,599 B1 | 9/2001 | Shimada et al. |
| 6,317,363 B1 * | 11/2001 | Guterman et al. ...... 365/185.23 |
| 6,317,364 B1 | 11/2001 | Guterman et al. |
| 6,370,061 B1 | 4/2002 | Yachareni et al. |
| 6,449,190 B1 | 9/2002 | Bill |
| 6,538,923 B1 | 3/2003 | Parker |
| 6,639,849 B2 | 10/2003 | Takahashi et al. |
| 6,671,207 B1 | 12/2003 | Parker |
| 6,717,851 B2 | 4/2004 | Mangan et al. |
| 6,738,289 B2 | 5/2004 | Gongwer et al. |
| 6,788,579 B2 | 9/2004 | Gregori et al. |
| 6,856,546 B2 * | 2/2005 | Guterman et al. ........ 365/185.2 |
| 6,862,218 B2 * | 3/2005 | Guterman et al. ...... 365/185.24 |
| 6,977,844 B2 | 12/2005 | Guterman et al. |
| 7,187,592 B2 | 3/2007 | Guterman et al. |
| 7,239,553 B2 | 7/2007 | Suitou et al. |
| 7,289,360 B2 | 10/2007 | Guterman et al. |
| 2002/0163838 A1 | 11/2002 | Guterman et al. |
| 2004/0042294 A1 | 3/2004 | Guterman et al. |
| 2004/0047195 A1 | 3/2004 | Guterman et al. |
| 2004/0165431 A1 | 8/2004 | Guterman et al. |
| 2004/0213049 A9 | 10/2004 | Guterman et al. |
| 2004/0246798 A1 | 12/2004 | Guterman et al. |
| 2005/0018481 A1 | 1/2005 | Guterman et al. |

FOREIGN PATENT DOCUMENTS

| | | |
|---|---|---|
| EP | 0725403 A1 | 8/1996 |
| EP | 0 851 429 | 7/1998 |
| JP | 6-1181168 | 8/1986 |
| JP | 1-304784 | 12/1989 |
| JP | 2-360 | 1/1990 |
| JP | 7287984 A | 1/1995 |
| JP | 10-011988 | 1/1998 |
| JP | H08-124389 | 5/2006 |
| WO | WO 90/12400 | 10/1990 |
| WO | WO 95/19047 | 7/1995 |
| WO | WO 97/07513 | 2/1997 |
| WO | WO 97/22123 | 6/1997 |

OTHER PUBLICATIONS

M. Kamiya et al., "EPROM Cell with High Gate Injection Efficiency", IEDM 82-741, IEEE (1982), p. 741-744.

J. Van Houdt, et al., "A 5-Volt-Only Fast-Programmable Flash EEPROM Cell with A Double Polysilicon Split-Gate Structure", Interuniversity Microelectronics Center (Feb. 1991).

Yale Ma, et al. "A Dual-bit Split-Gate EEPROM (DSG) Cell in Contactless Array for Single-Vcc High Density Flash Memories", IEDM 94-57, IEEE (1994), pp. 57-60.

G.S. Alberts et al., "Multi-Bit Storage FET EAROM Cell", G.S. IBM Technical Disclosure Bulletin, vol. 24, No. 7A (Dec. 1981), pp. 3311-3314.

Takeshi Nakayama, "A 5-V-only One-Transistor 256K EEPROM with page-Mode Erase", IEEE (Aug. 1989), vol. 24, No. 4, pp. 911-915.

Mike McConnell, et al., "An Experimental 4-Mb Flash EEPROM with Sector Erase", IEEE (Apr. 1991), vol. 26, No. 4, pp. 484-489.

Masaki Momodomi, et al., "A-4-Mb Flash. EEPROM with Tight Programmed V.sub.t Distribution", IEEE (Apr. 1991), vol. 26, No. 4, pp. 492-495.

Fujio Masuoka, et al., "A 256-kbit Flash E.sup.2 PROM Using Triple-Polysilicon Technology", IEEE (Aug. 1987).

Dumitru Cioaca, et al., "A Million-Cycle 256K EEPROM", IEEE (Oct. 1987), vol. SC-22, No. 5, pp. 684-692.

Cristiano Calligaro, et al., "A New Serial Sensing Approach for Multistorage Non-Volatile Memories", IEEE (1995), pp. 21-26.

Min-hwa Chi, et al., "Multi-level Flash/EPROM Memories: New Self-convergent Programming Methods for Low-voltage Applications", IEDM 95-271, IEEE (1995), pp. 271-274.

International Search Results & Annex (Communication relating to PCT/US98/15657).

Office Action for U.S. Appl. No. 10/900,498 mailed Sep. 15, 2005, 20 pages.

Office Action for U.S. Appl. No. 10/809,572, mailed Jun. 6, 2005, 6 pages.

Office Action for U.S. Appl. No. 10/921,450, mailed Jul. 13, 2005, 8 pages.

Office Action for U.S. Appl. No. 10/921,450, mailed Mar. 21, 2006, 7 pages.

Declaration of Interference, *Yachareni et al. v. Guterman et al.*, Patent Interference No. 105,475, mailed Jun. 12, 2006, pp. 1-6.

Joint Request for Adverse Judgment, *Yachareni et al. v. Guterman et al.*, dated August 17, 2006, Patent Interference No. 105,475, 5 pages.

Judgment—Request for Adverse, *Yachareni et al. v. Guterman et al.*, Patent Interference No. 105,475, entered August 23, 2006, 4 pages.

Email communication from Attorney for Assignee of U.S. Patent No. 6,370,061, dated August 23, 2006, 2 pages.

Notification of Reasons for Refusal, Application No. JPH11-512173, mailed May 7, 2008, 4 pages.

* cited by examiner

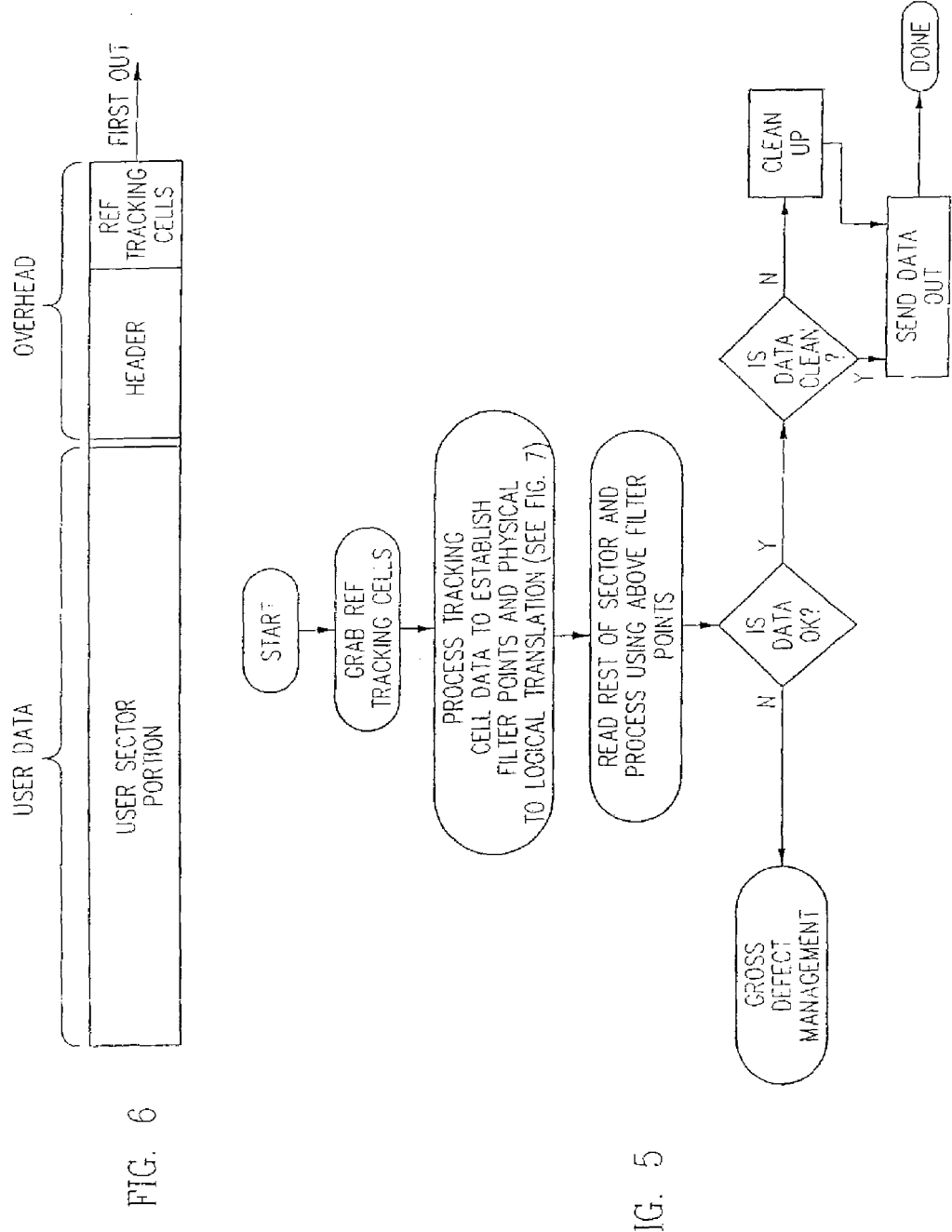

MULTI-STATE MEMORY

RELATED APPLICATIONS

This application is a continuation of U.S. application Ser. No. 12/110,489, filed Apr. 28, 2008, now U.S. Pat. No. 7,573, 740 which is a divisional of U.S. application Ser. No. 11/243, 344, filed Oct. 3, 2005, now U.S. Pat. No. 7,385,843 which is a divisional of U.S. application Ser. No. 10/410,672, filed Apr. 8, 2003, which is a continuation of U.S. application Ser. No. 10/013,592, filed Nov. 13, 2001, now U.S. Pat. No. 6,856, 546 which is a continuation of U.S. application Ser. No. 09/688,061, filed Oct. 13, 2000, now U.S. Pat. No. 6,317,364; which is a divisional of U.S. application Ser. No. 08/910,947, filed Aug. 7, 1997, now U.S. Pat. No. 6,222,762, all of which are hereby incorporated by reference.

FIELD OF THE INVENTION

This invention pertains to semiconductor memory devices and particularly to multi-state memories.

BACKGROUND OF THE INVENTION

As is well known, in a semiconductor memory cell, data is stored by programming the cell to have a desired threshold voltage. Simple memory cells store one of two states, a logical one or a logical zero, in which case the cell is programmed to either turn on or not turn on, respectively, when read conditions are established, thereby allowing the read operation to determine if a logical one or a logical zero has been stored in the memory cell. More sophisticated semiconductor memory cells allow the storage of one of a plurality of memory states greater than two, by providing the ability to store a variety of threshold voltages in the memory cell, each threshold voltage being associated with one of a plurality greater than two logical states. Such multi-state memory cells and arrays are described, for example in U.S. Pat. Nos. 5,043,940 and 5,434, 825 issued on inventions of Dr. Eliyahou Harari.

In order to fully exploit the concept of high density multi-state memory devices, the memory states must be packed as closely together as possible, with minimal threshold separation for margin/discrimination overhead. Factors which dictate this overhead are noise, drift (particularly random as opposed to common mode), sensing speed (deltaT=C*deltaV/I), and safety margin guard bands, as well as precision and stability of reference sources/sense circuits. This overhead must be added to the memory state width associated with precision of writing the memory cells (again with respect to the reference sources). With a closed loop write, in which a write is performed followed by a verify operation and in which cells which fail the verify operation are rewritten, the relative precision of memory cell to reference source can be made arbitrarily high by expending more time in writing. State packing will then be dictated more by how precise and stable the various storage sense points can be separated from one another, a property of both memory state stability and how reference points/elements are established.

SUMMARY

Maximized multi-state compaction and more tolerance in memory state behavior is achieved through a flexible, self-consistent and self-adapting mode of detection, covering a wide dynamic range. For high density multi-state encoding, this approach borders on full analog treatment, dictating analog techniques including A to D type conversion to reconstruct and process the data. In accordance with the teachings of this invention, the memory array is read with high fidelity, not to provide actual final digital data, but rather to provide raw data accurately reflecting the analog storage state, which information is sent to a memory controller for analysis and detection of the actual final digital data.

One goal of the present invention is to provide self-consistent, adaptive and tracking capability for sensing, capable of establishing both the data and the "quality" of the data (i.e. the margins). In accordance with certain embodiments of this invention, tracking cells are included within each of the sectors. These tracking cells are set at known states to reliably establish the optimum discrimination points for each of the various states. In certain embodiments, this is accomplished using as few as one cell per state. However, if better statistics are vital to establishing the optimum discrimination point, a small population of cells sufficient to establish such optimum points statistically is used. Data from these tracking cells will be the first information from the sector to be read into the controller, in order to establish the optimum discrimination points for the remainder of the sector data. In order to make these cells track the rest of the sectors in terms of data history and wear, they are subjected to the same logical to physical data state translation (rotation) writing as used for their associated sectors.

In accordance with various alternative embodiments of this invention, high density multi-state memories are taught which include parallel, full chunk, A/D conversion of multi-state data, with adequate resolution to provide analog measure of the encoded states; master reference cell(s) whose prime function is to provide optimum dynamic range for comparator sensing; Logical to Physical Data scrambling to provide both intra-sector wear leveling and increased endurance capability; and intra-sector tracking cell groups, one for each state, included in each sector to provide optimum compare points for the various states, and able to adapt to any common mode shifts (e.g. detrapping). In accordance with certain embodiments, a controller incorporates a data processing "engine" to, on-the-fly, find midpoints of each tracking cell group. The controller also establishes data state discrimination and marginality filter points. Sector data is passed through the controller, giving both the encoded memory state, and its quality (marginality), for each physical bit If desired, the controller decides what actions must be taken to clean up (scrub) marginal bit data based on the quality information (e.g. do full sector erase and rewrite versus selective write, only). Also, if desired, the invention includes a small counter on each sector which is incremented each time a read scrub is encountered. When the count reaches maximum allowed, marginal bit(s) are mapped out rather than rewritten and counter is reset to 0. This provides a filter for truly "bad" bits. Similar features are applied in reverse to write multi-state data back into a sector, using the same circuitry as used for read but operated in reverse, to provide self-consistent data encoding. In addition, two alternative embodiments for performing verification are taught: using a reference current staircase to sequentially scan through the range of states, conditionally terminating each cell as the current step corresponding to its target data is presented to the sensing circuit; and using a full set of N−1 reference currents of the N possible states to simultaneously verify and conditionally terminate all cells. In certain embodiments, a twin-cell option is included in each sector to provide deltaVt shift level associated with cycling driven trapping and channel wearout, triggering sector retirement before detrapping shifts exceed read dynamic range or other potential read errors. This replaces hot count based sector retirement, greatly increasing usable endurance.

As another feature of certain embodiments of this invention, a cell-by-cell column oriented steering approach, realizable in two source side injection cell embodiments, increases the performance of high level multi-state significantly, improving both its write and read speed. It achieves this by applying, in parallel, custom steering conditions needed for the particular state of each cell. This offers substantial reduction in the number of individual programming steps needed for write, and permits powerful binary search methodology for read, without having to carry out full sequential search operations. Improved performance is further bolstered through increased chunk size, made possible via the low current source-side injection mechanism, which allows every fourth floating gate element to be operated on, thereby increasing chunk size.

BRIEF DESCRIPTION OF THE DRAWINGS

FIG. 1b is a graph depicting the voltages associated with sensing the state of the memory cell of the embodiment of FIG. 1a;

FIG. 5 is a flow-chart depicting the operation of one embodiment of this invention;

FIG. 6 is a bit map depicting user data and overhead data associated with one embodiment of the present invention;

DETAILED DESCRIPTION

A/D Sensing

A first step in this invention is acquiring the full analog value of the memory state (e.g. the actual cell current, which in turn reflects the actual stored floating gate voltage VFG). The following describes two alternative embodiments for rapidly sensing and converting, to digital form, data stored in a large number of physical cells (e.g. a chunk of 256 cells) simultaneously, each cell capable of storing a large number of multi-states (e.g. four states or more), and sensing capable of spanning a wide dynamic range. The basis underlying both of these embodiments is the analog property of the memory cell, wherein its current drive capability is in proportion to its stored floating gate charge (voltage). Consequently, each memory state is characterized by its current drive capability (in actuality a narrow range of current drives, including margin capability). Therefore sensing and discriminating the various states comes down to differentiating between the various drive level ranges. Two exemplary embodiments are now described for achieving this differentiation.

Figure 1B:
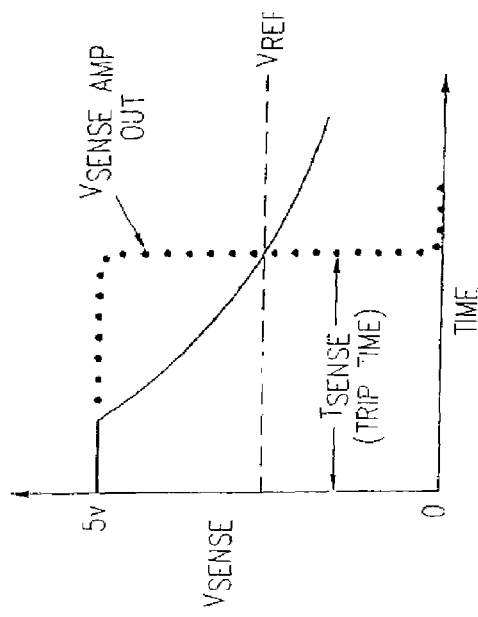
Figure 1A:
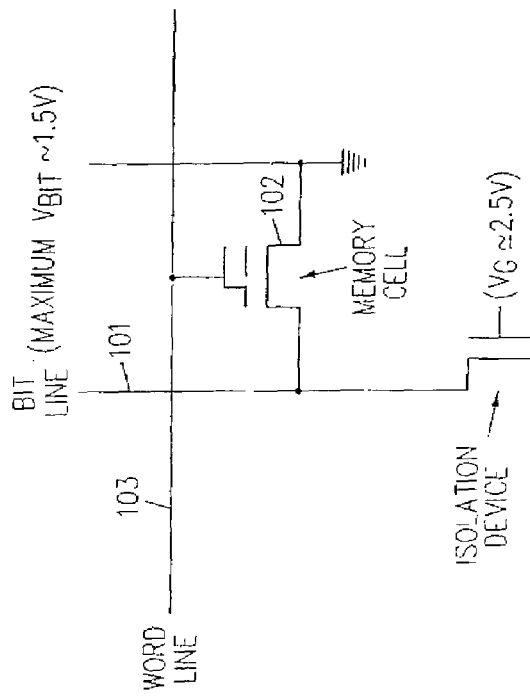
FIG. 1a is a schematic representation of one embodiment of this invention which utilizes dynamic sensing of the selected memory cell.

A first embodiment is described with reference to FIGS. 1a and 1b, and involves dynamic-type sensing, wherein the bit lines (such as bit line 101) of the selected memory cells (such as cell 102) are precharged (e.g. to 2.5v), and then the row (e.g. word line 103) of the selected cells is turned on, preferably using a controlled ramp (e.g. 5 usec rise time) or a stepped staircase (for example over 5 usec), allowing the respective bit lines to discharge through the selected memory cells at rates proportional to their current driving capability. When the bit lines discharge to a predetermined voltage (e.g. 1v), they flip a corresponding sense amplifier (e.g. sense amplifier 104), indicating sense achieved. The time taken to flip the sense amplifier from the start of sensing is an analog measure of the cell drive: the longer the time, the lower the drive (i.e. cell is more programmed, having more negative charge on the floating gate as depicted in FIG. 1b).

Table 1 is an example of sense amplifier trip time to cell current drive capability based on simulation using floating gate cell I-V data.

TABLE 1

| | ICELL (uAmps) | | | | | | | | |
|---|---|---|---|---|---|---|---|---|---|
| | 20 | 30 | 40 | 50 | 60 | 70 | 80 | 90 | 100 |
| Trip time (usec) | 5.4 | 4.9 | 4.7 | 4.4 | 4.2 | 3.9 | 3.7 | 3.5 | 3.4 |

In the example of Table 1, bit line 101 is precharged to 5v and tripped at 2.5v, load capacitance is 1.25 pF and control gate rate of increase is 1.25v/usec, ramped to 7v in a staircase fashion. Because of disturbs, it is undesirable to expose the memory cell drain to more than 2v. Therefore the 5v precharge is, in one embodiment, applied to sense capacitor 105 isolated from the memory cell drain, and the drain is only allowed to charge to a lower voltage (e.g. 1.5v). With column segmentation this drain voltage lowering is, in one embodiment, done locally, using a segment select transistor to limit the voltage transferred from a global bit line to the local bit line, such as is described in copending U.S. Pat. No. 5,315,541 assigned to Sandisk Corporation.

Figure 2:
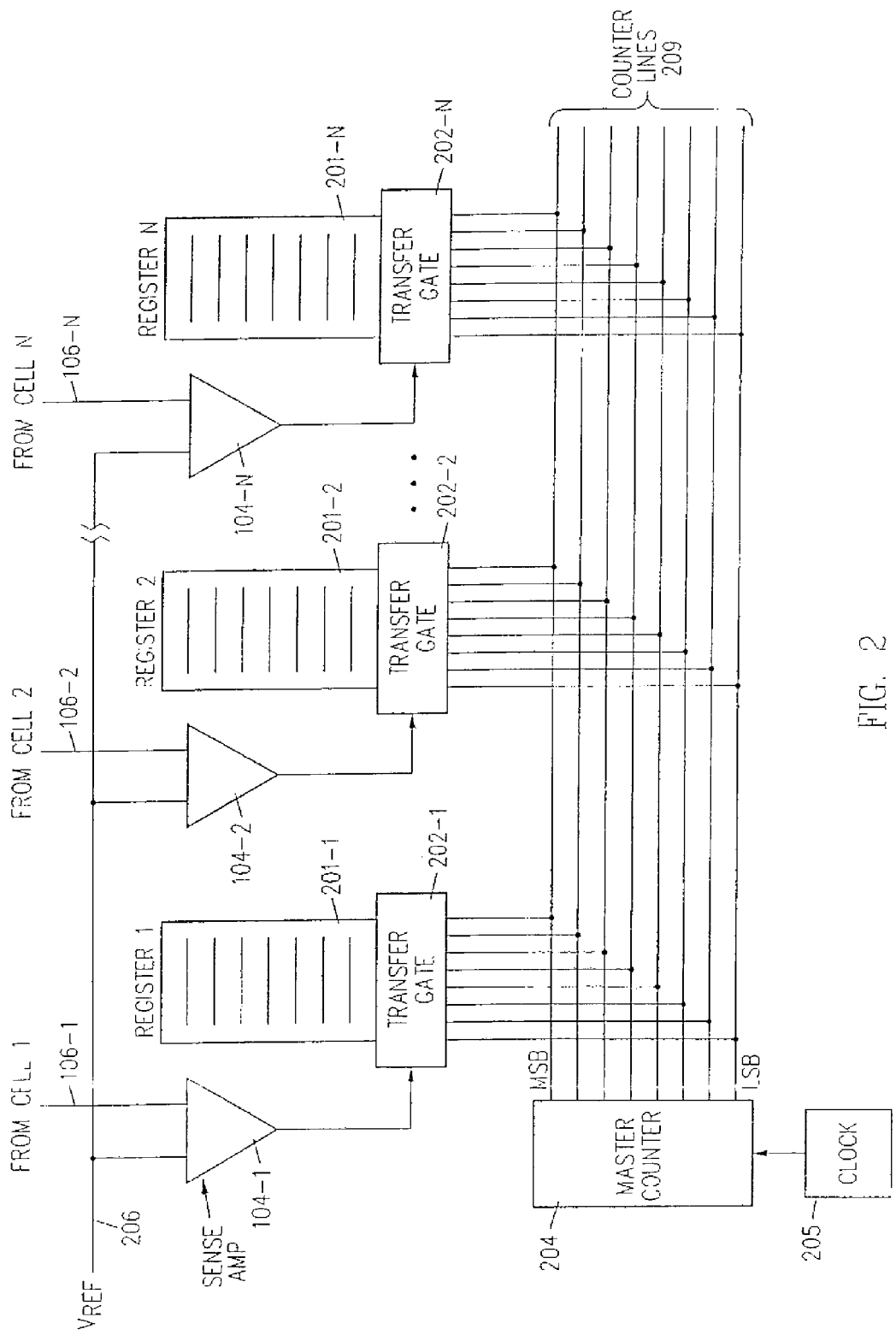
FIG. 2 is a block diagram depicting one embodiment of this invention in which trip times associated with reading a plurality of cells are converted to binary code.

In one embodiment, the trip times are converted en masse to a binary code using an AND approach, as shown in FIG. 2. Time is metered using clock 205 which increments master counter 204 which in the example shown here is an 8 bit counter. Counter 204 drives lines 209 (8 lines in this example) which feed into registers 201-1 through 201-N via transfer gates 202-1 through 202-N, respectively, with one register for each cell being sensed (e.g. 256, 8-bit registers for a 256 bit memory chunk size). At the start of sensing, counter 204 is initialized to zero, and then starts counting up, with the registers reflecting the count.

At the point of a cell sensing (i.e. at the sense amplifier trip time), the corresponding sense amplifier flips, which isolates the corresponding register from counter 204, thereby freezing the time (and its associated binary code) in that register. In this way, each register contains a binary representation of the analog storage level of the memory cell to the resolution of the AD (e.g. with 8 bits this gives resolution of approximately 1 part in 256 or about 0.4%).

To insure both adequate resolution and dynamic range, the clock frequency (i.e. sampling rate) must be properly chosen. If too fast it will not span the full range of times needed for a sense amplifier to flip for all possible stored memory cell data values before hitting the maximum count, while if too slow the result will be poor resolution and the risk of inability to discriminate between neighboring states. In order to provide some relationship with the memory cells' drive characteristics, in one embodiment the frequency of clock 205 is governed by a memory cell (or group of memory cells) set at an appropriate drive level. In this way, clock 205 tracks process variation and operating conditions (e.g. voltage and temperature), setting up the optimum clocking rate to span the cell's dynamic range and associated memory states.

Although this embodiment is relatively simple and effective, it does have limitations by nature of its being dynamic. Time constants associated with word line and/or bit line delays and their variations contribute both relative and absolute error. For example, if word line RC time constants are long relative to ramp (or step interval) times, then there can be significant differences in the times in which cells along the word or steering line (or a single line serving as both the word line for selection and steering line for capacitive coupling) experience a given word line steering drive voltage. The consequence of this is that cells at different positions along such lines will respond at different times. Also, conversion from cell current drive to comparator trip time is not exactly linear, because the discharge rates and characteristics depend on the drive levels of the cell which will vary with the bit line bias level (with conduction tending to decrease as bit line voltage levels drop, stretching out bit line discharge time). Also, the bit line capacitance can have a significant voltage dependence arising from junction CV characteristics. This nonlinearity in comparator trip time results in nonlinearity in time in the separation of states and margins in going from the lowest to the highest charged memory states (whereas it is desirable to space the memory states evenly, charge-wise, to get maximum fit of states within the dynamic range and to have uniform margins).

Figure 3:
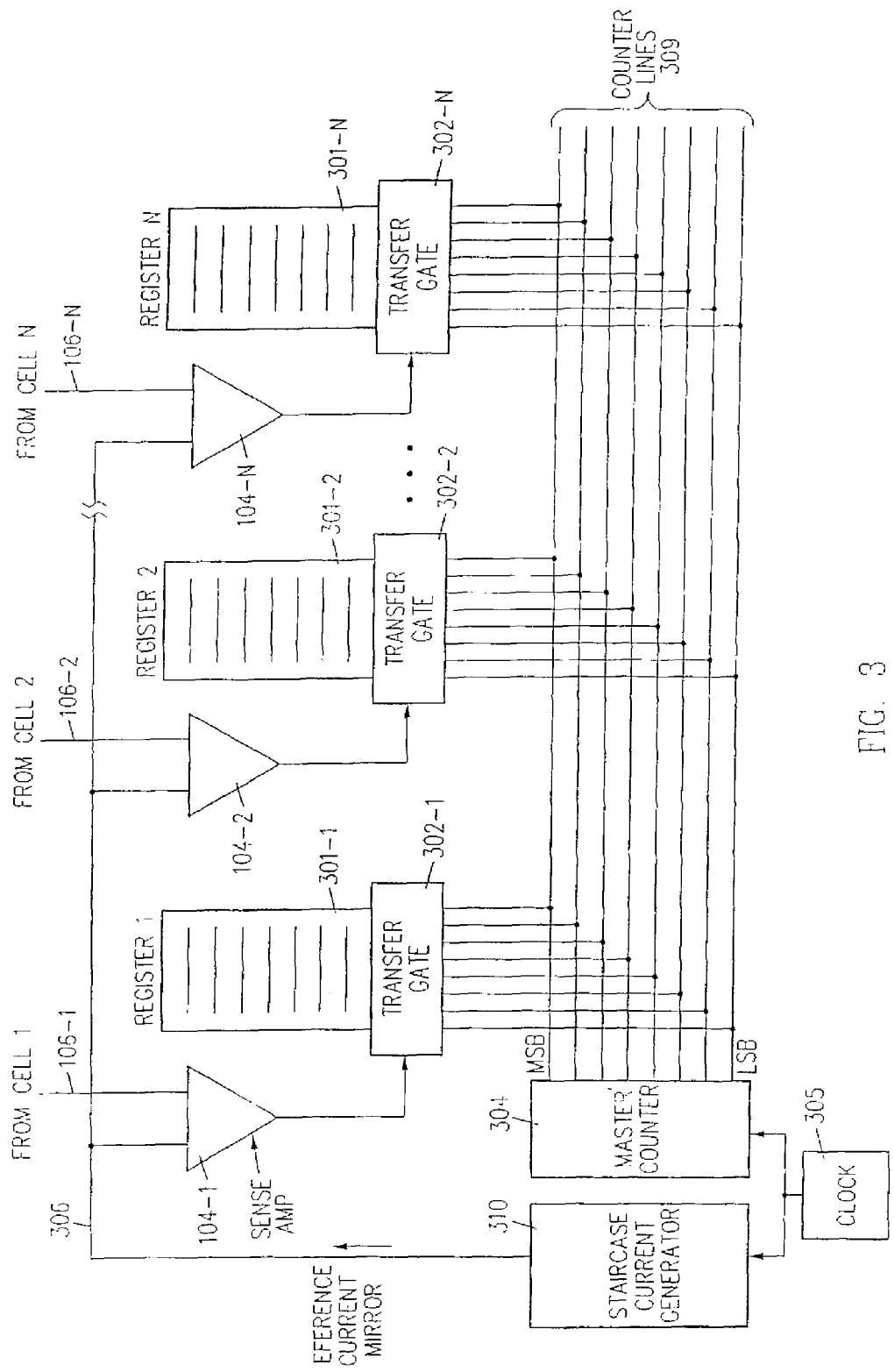
FIG. 3 is an alternative embodiment of this invention which uses a static sensing approach utilizing current comparators.

A second exemplary embodiment removes these limitations by using a static sensing approach utilizing current comparators, as shown in the exemplary embodiment of FIG. 3. The fixed reference voltage, Vref, of the embodiment of FIG. 2 is replaced with a staircase reference current (Iref) source 310, which starts off at a minimum level, Imin, and increments by _I with each count of clock 305 (i.e. after n clock pulses Iref=Imin+n*_I). For a given memory cell, when the reference current just exceeds the cell current, the associated one of current comparator sense amplifiers 104-1 through 104-N will flip, freezing the corresponding count of counter 304 (which increments in sync with staircase current generator 310) into the corresponding one of registers. In one embodiment, the scale factor for staircase current source 310 (e.g. its maximum current) is established using one or a population of floating gate memory cells (e.g. erased strongly) in order to provide optimum dynamic range with tracking of process and operating conditions; i.e. the regulation of current source includes monitoring the characteristics of one or more floating gate cells dedicated for use in connection with this current source regulation.

This second embodiment, while a bit more complex, offers better control, linearity and minimizes or eliminates sensitivity to dynamic effects. This includes eliminating the need for repetitive, controlled ramping of word lines in the case of dynamic sensing, simplifying many of the timing and associated control operations.

Once sensing is completed and data is frozen into all registers 301-1 through 301-N, it is shifted out, for example, serially. A simple way to do this is to have the registers 301-1 through 301-N tied together in shift register fashion. In the above example, the data stored in each register each comprises eight bits, requiring an eight line wide bus to shift the full data out of the memory chip (for example to a memory controller, such as is described in U.S. Pat. No. 5,430,859 assigned to Sandisk Corporation, for sending to requesting devices) in one controller clock cycle, and thus requires eight output pads/pins. If data rate to the controller is less critical while keeping the number of pads/pins down is important, then the eight bits could be broken down, e.g. shifting out the four MSB bits first followed by the four LSB bits through four pads in two controller clock cycles, or shifting out groups of two bits four times through two output pads in four controller clock cycles, etc.

Tracking/Data Scrambling

As previously stated, one goal of the present invention is to provide self-consistent, adaptive and tracking capability for sensing, capable of establishing both the data and the "quality" of the data (i.e. the margins). In accordance with certain embodiments of this invention, tracking cells are included within each of the sectors such as those described in U.S. Pat. No. 5,172,338 assigned to Sandisk Corporation. These tracking cells are set at known states to reliably establish the optimum discrimination points for each of the various states. In certain embodiments, this is accomplished using as few as one cell per state. However, if better statistics are vital to establishing the optimum discrimination point, a small population of cells sufficient to establish such optimum points statistically is used. For example in one embodiment ten physical cells are used for each state, in which case for 4-state encoding a total of 40 physical cells are used, as part of the overhead portion of the sector.

As will be described below, data from these tracking cells will be the first information from the sector to be read into the controller, in order to establish the optimum discrimination points for the remainder of the sector data. However, in order to make these cells track the rest of the sectors in terms of data history and wear, they are not repeatedly erased and written into the same, fixed, pre-assigned states. This is because the amount of wear will be peculiar to that state and may not reflect the wear/history of the remainder of the sector. In one embodiment, managing wear, both in terms of insuring uniformity (i.e. intra-sector wear leveling) and in keeping such wear to a minimum, is handled by some method of continuous or periodic re-assignment of each of the logical states (e.g. logical states L0, L1, L2 and L3) to a corresponding physical state (e.g. physical states P0, P1, P2, and P3), an example of which is shown in Table 2. These physical states P0 to P3 correspond to specific conduction levels of each memory cell; e.g. P0 is the highest conducting state, P1 is the next highest conducting state, P2 the next highest, and P3 the least conductive state. A description of this concept applied to two state encoding and termed "program/inverse program" is disclosed in U.S. Pat. No. 5,270,979 assigned to Sandisk Corporation.

Re-assignment of states with subsequent writes (in one embodiment with each subsequent write, and in alternative embodiments after a specific number of writes) is done, for example, by rotation or on a random number basis. This guarantees that, on the average, over many cycles, only about half of the full possible charge is transported to the cells, and that the wear of each cell is virtually identical to all others within its sector. The embodiment utilizing a random number assignment between logical and physical states has the advantage that it eliminates the possibility of synchronization between the logical to physical data re-assignment algorithm and variable user data, which would defeat such wear leveling.

TABLE 2

| Logical State | Physical State Assignment | | | |
|---|---|---|---|---|
| | #1 | #2 | #3 | #4 |
| L0 | P0 | P3 | P2 | P1 |
| L1 | P1 | P0 | P3 | P2 |
| L2 | P2 | P1 | P0 | P3 |
| L3 | P3 | P2 | P1 | P0 |

All tracking cells for each given logical state are re-assigned to the same physical state, e.g. all ten cells of one tracking group assigned with the role of storing logical state L1, are set to either P0, P1, P2 or P3, for a particular write cycle, dictated by the scrambling algorithm. Given that the tracking cells go through the same scrambling operation as the remainder of the sector, they not only reflect the wear of that sector, but also provide the translation means to convert back from physical to logical state. Since each tracking group is given a constant pre-assigned logical state responsibility, when the controller deciphers the various tracking cells groups (e.g. the four groups of ten cells each) it will concurrently establish the translation for the sector.

Resolution Requirements

More resolution requires more time to sense (more steps in the A/D), more die area associated with the larger registers, more cost associated with shipping data out to the controller (more parallelism dictates more pads and thus an area penalty or, with same number of pads, takes longer to shift out all the data, and thus a performance penalty), and more cost associated with processing the data in the controller. Inadequate resolution results in limited visibility in common mode population margin shifts (e.g. due to trapping/detrapping effects), resulting in larger error in establishing comparator points. This larger error must be included in the multi-state budget, forcing larger separation between states, and consequently fewer states, i.e. lower multi-state scalability.

A reasonable resolution target is A/D resolutions equal to approximately 3% of the state-to-state separation. This provides visibility into sufficiently small cell current shifts within a population to allow meaningful correction (i.e. avoiding margin failure from tail bits within a population due to poorer resolution), and does not impose such a high resolution that it becomes meaningless vis a vis the various noise and error terms associated with setting and measuring states.

Figure 4A:
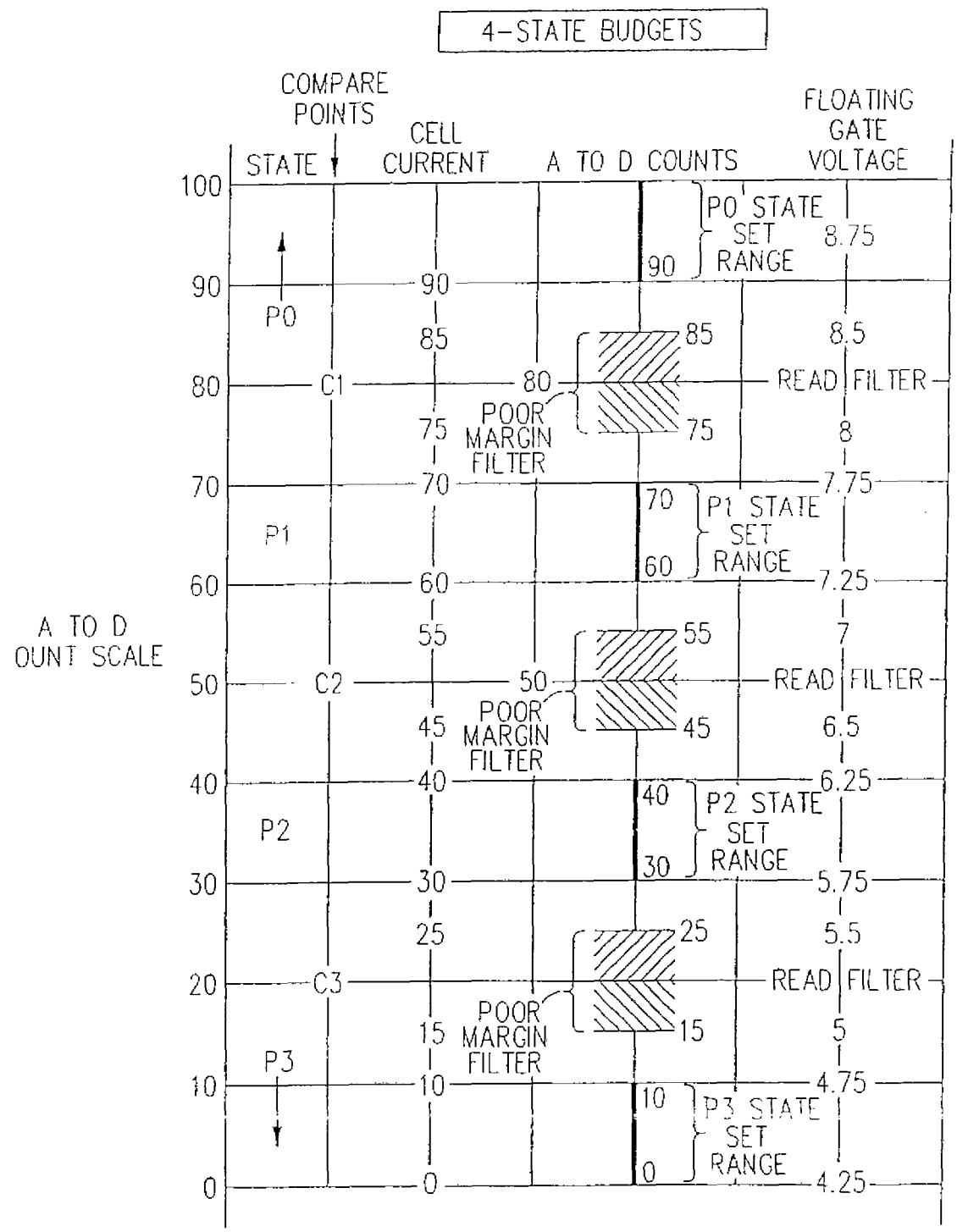
FIG. 4a is a diagram depicting exemplary state ranges and counter/A/D resolution for 4-level multi-state encoding.

Specific examples for state ranges and counter/AND resolution are shown in FIGS. 4a and 5b for 4-level and 8-level multi-state encoding, respectively. The cell current/floating gate voltage relationship used in FIGS. 5a and 5b for read are representative of cell characteristics built in accordance with the teachings of the present invention, using 0.5 micron based flash semiconductor fabrication technology available today, which for example has an I/V slope of approximately 20 uamps/volt with the zero current intercept (projected threshold) at 4.25v.

In the example shown, the state-to-state separation for a four state cell is 30 uamps, the A/D resolution is 1 uamps and the dynamic range covered is 0 to 128 uamps. This gives about a 1/30 resolution of the state to state separation (3.3%). A population of cells written into a given intermediate state is confined to a 10 uamp window, i.e. spanning ten steps of resolution. Therefore 1 A/D step bit offers a 10% resolution of the written population distribution, and any common mode shift of that magnitude, over time, can be corrected in 10% resolution steps. Therefore, for 4-state a 7 bit A/D is suitable.

Figure 4B:
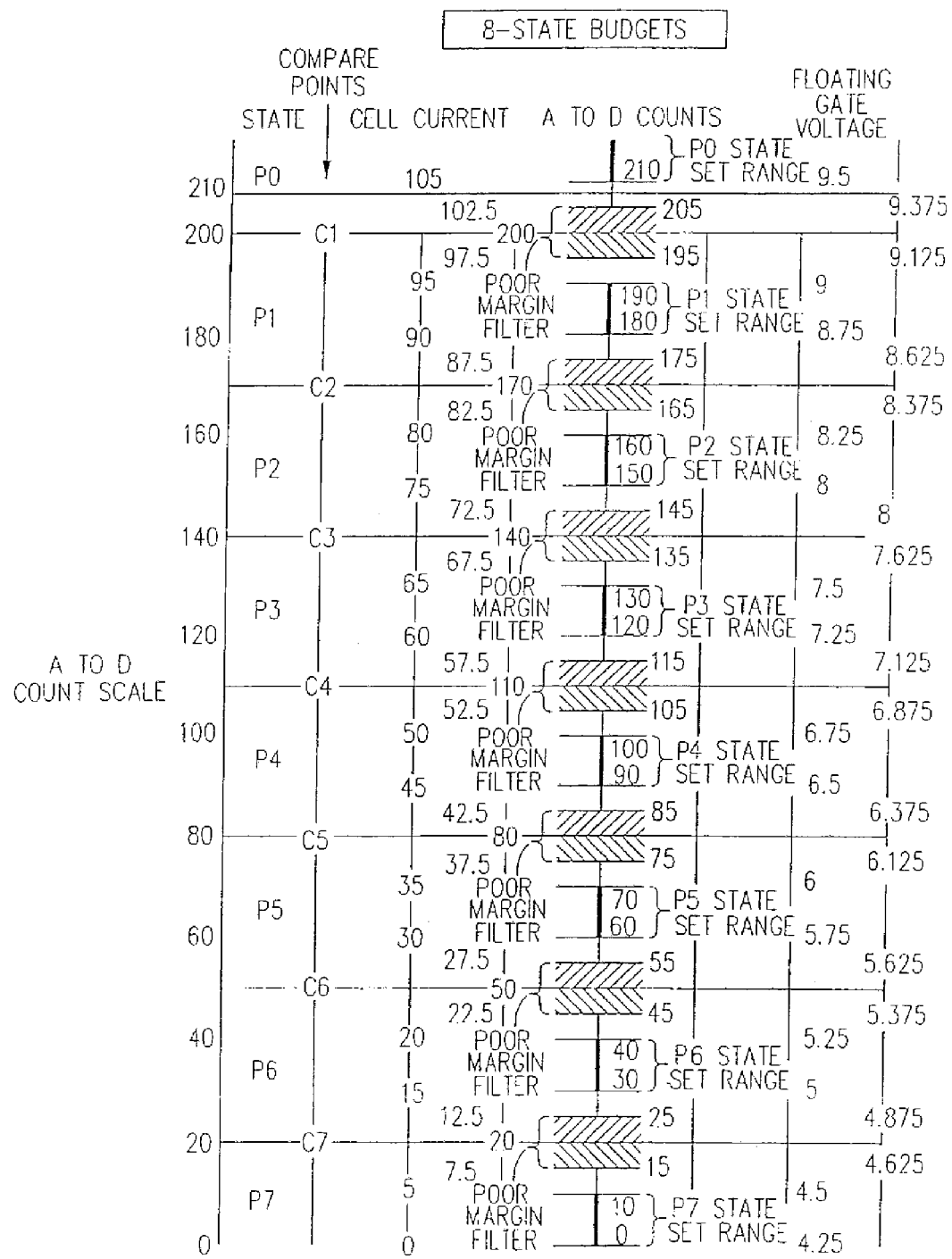
FIG. 4b is a diagram depicting exemplary state ranges and counter/A/D resolution for 8-level multi-state encoding.

The situation is similar for the eight state example of FIG. 4b, except state to state separation is 15 uamps, and A/D resolution is 0.5 uamps, covering the same 0 to 128 uamps dynamic range. This offers the same percentage of the population resolution, for which an eight bit A/D is suitable.

Adaptive Multi-State Discrimination

The following describes the data flow and handling by the controller for each sector read operation. In order to support high speed, in one embodiment this operation is performed in hardware and/or firmware. For the purposes of the following discussion, the example of 4-state encoding, with 7 bit sensing resolution (providing 128 steps on the order of 1 uamp per step) and ten tracking cells for each of the four states, is used. FIG. 4a depicts 4-state encoding with each bit of resolution corresponding to approximately 1 uamp (therefore about a 100 uamp full range). In the embodiment depicted in FIG. 4a, 4-states are shown, physical states P0, P1, P2, and P3. State P0 is established by setting the cell to have a cell current under read conditions of 90 uamps or more (e.g. by erasing the cell to that value), When reading, state P0 is detected when cell current is 85 uamps or more, thereby allowing a slightly relaxed tolerance for reading than writing. The programming levels for states P1, P2, and P3 are also shown in FIG. 4a, as are the looser read current levels for each of those states. An appropriate guard band is placed between each state such that, for example, a cell current during read between 75 and 85 uamps is too ambiguous to be associated with either of adjacent states P0 and P1.

Figure 7:
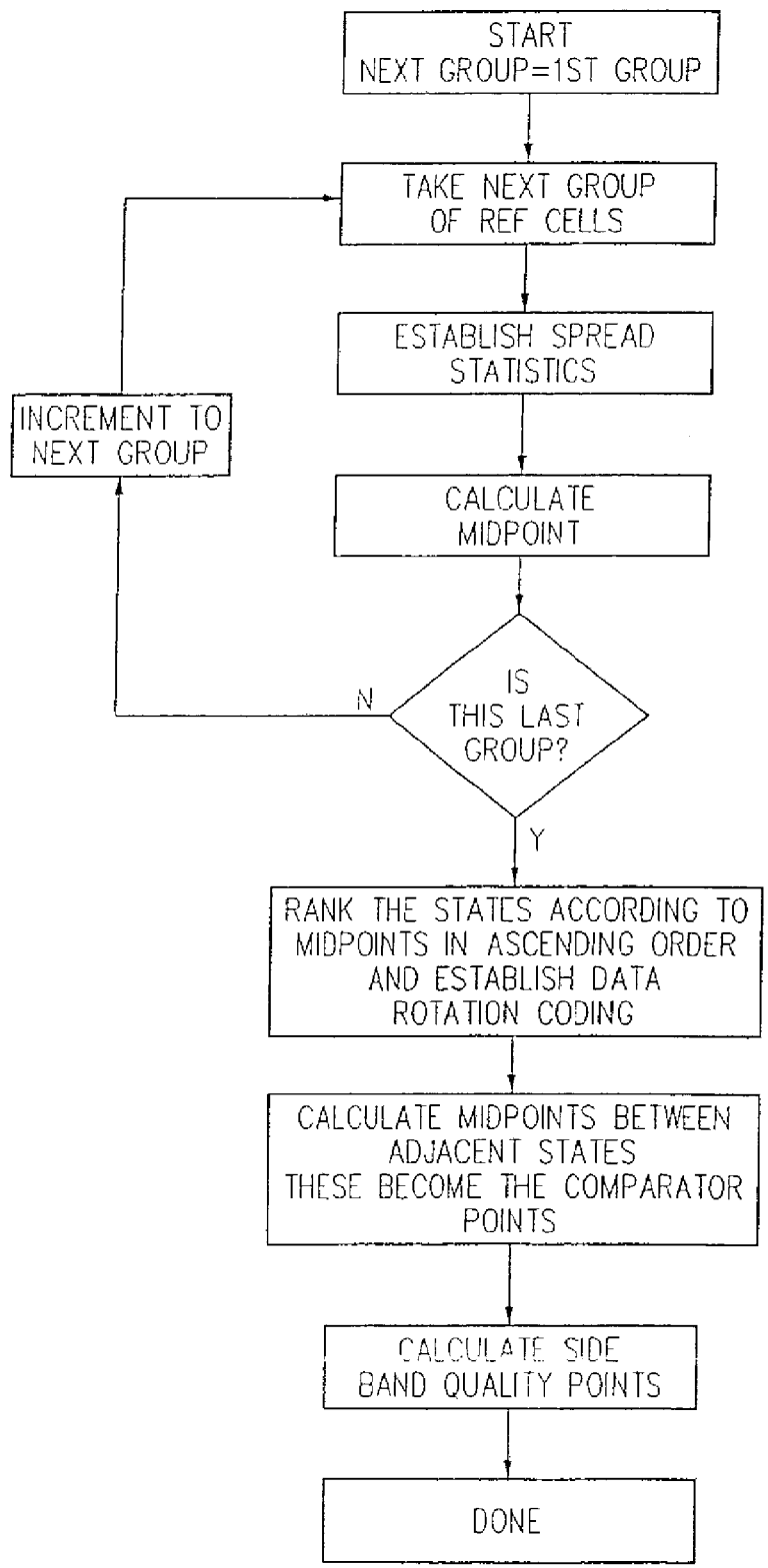
FIG. 7 is a flowchart depicting in more detail one embodiment of the step of processing tracking cell data in FIG. 5.

The operation of this embodiment will now be described with respect to the flowchart of FIG. 5 and the diagram of FIG. 6. First, the reference tracking cells' data is shifted into the controller, one 8 bit set (or byte) for each cell. This data is then processed as illustrated in more detail in the flowchart of FIG. 7, starting with the first tracking cell group assigned to logical state L0 as described in Table 2. The function of these bits is to establish the optimum compare point for the L0 state by first establishing where the center of the population of tracking cells placed into the L0 state is. This can be accomplished on the ten cells per state population by continuously summing each successive data of the ten L0 cells, giving accumulation of those ten cells' data. It is desirable to maintain a max and min register concurrently, in order to minimize chance of error from an isolated, errant cell, either high or low. This is done by comparing each successive piece of data to the previously stored comparator data and at each compare operation storing the higher (lower) into the max (min) comparator. Once data from all ten cells have shifted in, it is processed to establish the filter point, for example by subtracting the max and the min from the sum and dividing the result by 8 (i.e. shifted to right three times), giving the average storage level of the L0 assigned tracking cells. Rounding to the nearest number is, in one embodiment, accomplished by shifting to the right three times but temporarily storing the third bit shifted and then summing this bit with the shifted value. This is then repeated for the L1, L2 and L3 tracking cell population, at which point the system has determined the physical to logical conversion for each state. In one embodiment, this conversion is performed by ordering the L0, L1, L2, and LS states into descending order, and then matching this to the corresponding physical state assignment as shown in Table 2. For example, if L0 happens to correspond to physical state P0 it will have the highest value of the four states, if L0 corresponds to physical state P1 it will have the next highest value, and so forth, and likewise for states L1, L2, and L3. If after ordering the order is L0, L1, L2, L3 then state assignment #1 of Table 2 was used. On the other hand, if the order is L1, L2, L3, L0 the assignment #2 was used, and so forth per Table 2. In this embodiment, the optimum discrimination points between the four physical levels, P0, P1, P2, and P3 are established by calculating the midpoints between P0 and P1, P1 and P2, and P2 and P3. Slightly better precision is achieved by postponing the division by 8 for the individual ten cell groups until after summing P0 and P1, P1 and P2, etc., at which point the average of P0 and P1 is obtained by summing P0 and P1 and dividing by 16 (shifting four to the right with provisions for rounding) and similarly for P1 and P2, and P2 and P3, thereby establishing three compare values, C1, C2, C3, respectively, which are shown in FIG. 4a as current points 80, 50, and 20 between states P0, P1, P2, and P3.

This then gives the optimum compare or filter points for the rest of the sector's data, which is now shifted in. As data is passed through, it is sifted through a set of comparators (for example, as described later with reference to the flowcharts of FIGS. 5 and 7) set at those compare points to establish their state; i.e. higher than C1, (making it state P0), between C1 and C2 (making it P1) between C2 and C3 (making it state P2) or lower than C3 (making it state P3). These are then translated to their corresponding logical states, based on the specific logical to physical assignment used, as discussed above. In one embodiment, compare points C1, C2, C3, loaded into the comparators are adaptive in nature, established by the sector itself via the tracking cells. In this way the sensing tracks the properties of the population of cells within the sector, their operating voltage and temperature conditions, history and wear, and any common mode drift, as for example may arise from detrapping of gate oxide trapped charge, accumulated during write cycling. Since such detrapping is also present in the tracking cells, they establish the optimum point for sensing, whatever the degree of detrapping, provided their conduction remains within the dynamic range of cell state sensing capability (i.e. ability to still discriminate between the various states), and the mechanism is truly common mode, with minimal dispersion.

In one embodiment, this adaptive adjustment of the compare points is performed in a continuous, real time manner. In an alternative embodiment, the optimum compare points for the L0 state as well as the other states L1-L3 are established periodically as part of a maintenance operation, and not in real time as actual data is being read, to reduce impact on system performance. This latter approach improves performance by eliminating the repetitive overhead time associated with processing the tracking cell data. In one embodiment, it is invoked on a predetermined read interval basis as part of a read/margins checkout, and/or invoked in the rare event of read marginality or failure. This gives the ability to recover data or restore margins through data rewrite using the most optimum read reference conditions via the tracking cells.

In one embodiment, a sector is broken down as shown in FIG. 6, to include user data and overhead bytes. The overhead bytes include a plurality of reference tracking cells for monitoring the condition of one or more cells known to be programmed to each of the logical states in the multi-state memory. The overhead also includes, if desired, header information such as address information, ECC bits, bit and/or sector mapping related information, and counts of the number of writes to the sector. Referring again to FIG. 5, as the rest of the sector's data is read and processed using the compare points established based on the referenced tracking cells' characteristics, a decision is made as to whether the data is acceptable or not. If not, gross defect management is invoked, such as described in U.S. Pat. No. 5,602,987. On the other hand, if the data is acceptable, a decision is made as to whether the data is "clean", i.e. of a sufficiently high quality that there no data margin or ECC related problems. If the answer is yes, the data is sent out to the host without further intervention; conversely if the answer is no (i.e. the data is not clean), the necessary error correction or "clean up" step is invoked thereby not only sending the data out to the host but also insuring that the corrected data is clean upon subsequent reads.

Data Quality Assessment and Response

As described above, one feature derived from this invention is the ability to concurrently determine not only the data itself but also the "quality" of each data point, or its margin, with respect to the above described compare points. Even when a bit of data is read correctly, if it gets too close to a compare point, it may become unreliable sometime in the future, giving erroneous readings due to noise sensitivity, additional margin shift, or change in operating conditions arising from power supply or temperature variation. Therefore, the quality measurement achieved by this invention provides a failure look-ahead capability, something dealt with in prior art, using special read-under-margin operations. Such prior art read-under-margin operations generally involve multiple pass reads, invoked under special conditions or circumstances, and requiring special circuitry (which may include controlled changes to reference/sensing circuitry or special cell biasing operation) to establish the needed margin differentials. Often, the accuracy or resolution of such differential means is limited, forcing larger margins than absolutely required. In the case of multi-state, this would dictate wider memory threshold voltage windows per state, and consequently wider voltage separation between states, thereby resulting in fewer states available for a given cell's dynamic voltage range, and consequent lower memory storage density per cell. However, with the novel approach of the present invention, the margin or "quality" of the data is a natural byproduct of each read operation, requiring no special modes or events to initiate it, and allowing the system to instantly react to any detection of marginal data. In essence, the capability of a "look ahead data recovery" is automatically included each read operation. However, instead of such margining operation being considered a very rare operation for a very rare event, in accordance with the present invention, the trade-off made in order to achieve high density multi-state is to allow a substantially higher incidence of such marginality, with such marginality being made manageable by providing a measure of this marginality as part of the standard read operation.

In one embodiment, the specific way such marginality detection is implemented includes, around each of the compare values C1, C2, C3, an additional pair of values C1+del, C1-del, C2+del, etc., shown in FIG. 4a as "poor margin filter", and associated comparators (not shown). Any data falling between the compare points C1, C2, C3 and their associated +/−del points is tagged as marginal (e.g. if state P2, which falls between compare values C2 and C3, is detected to be between C2 and C2-delta or C3+delta and C3, it is then tagged as marginal). Consequently, each piece of 4-state data can have a three bit result, the first two bits, A and B, for the actual data and a third bit, Q, for its marginality or 'quality' (e.g. 0 if OK and 1 if marginal), as depicted in Table 3.

TABLE 3

| RESULTS | NO MARGINALITY PROBLEMS | | | | MARGINAL DATA | | |
|---------|---|---|---|---|---|---|----|
| A | 0 | 0 | 1 | 1 | 0 | 0 | 11 |
| B | 0 | 1 | 0 | 1 | 0 | 1 | 01 |
| Q | 0 | 0 | 0 | 0 | 1 | 1 | 11 |

In one embodiment, the quality of the data includes additional information, for example whether the sensed parameter (e.g. cell current) is too high or too low with respect to the center of that state's population (e.g. for state P2, if found between C2-delta and C2 it is too high, whereas if between and C3 and C3+delta it is too low), This allows clean up reaction conditional on its direction of marginality. For example, if a memory cell's marginality is a consequence of being shifted towards being too heavily programmed, the course of action is to re-erase and program that data as is part of a full sector data scrub operation. On the other hand, if a memory cell's marginality is such that it is shifted towards being too heavily erased, recovery of proper margin for the state of the memory cell is accomplished by programming only that one memory cell slightly in order to regain its needed margin or "quality". An example of the latter is the case of relaxation of trapped channel electrons (which can accumulate after a large number of writes to a cell or a group of cells) which causes cell margins to drift from a more to a less heavily programmed condition. In such a case, it is sufficient to add some programming operations to regain cell state margins; no sector erase before programming is required.

In one embodiment, a count is stored within each sector as part of the sector's header whose function is to be incremented each time a corrective action associated with a read scrub takes place. Once this count reaches a maximum allowed level, CMAX, the corrective action invoked is to map out the marginal/failing bits, whereas prior to reaching this CMAX value, data is rewritten without such mapping. This embodiment preserves the sector longer prior to the entire sector being retired from service, by avoiding nuisance marginalities resulting in excessive bit and sector mapping, while filtering out the truly bad bits which should be mapped out. Once the CMAX count is reached for a sector and the failing marginal bit is mapped out, the counter is reset to zero and the procedure is repeated.

Multi-State Writing

Figure 8:
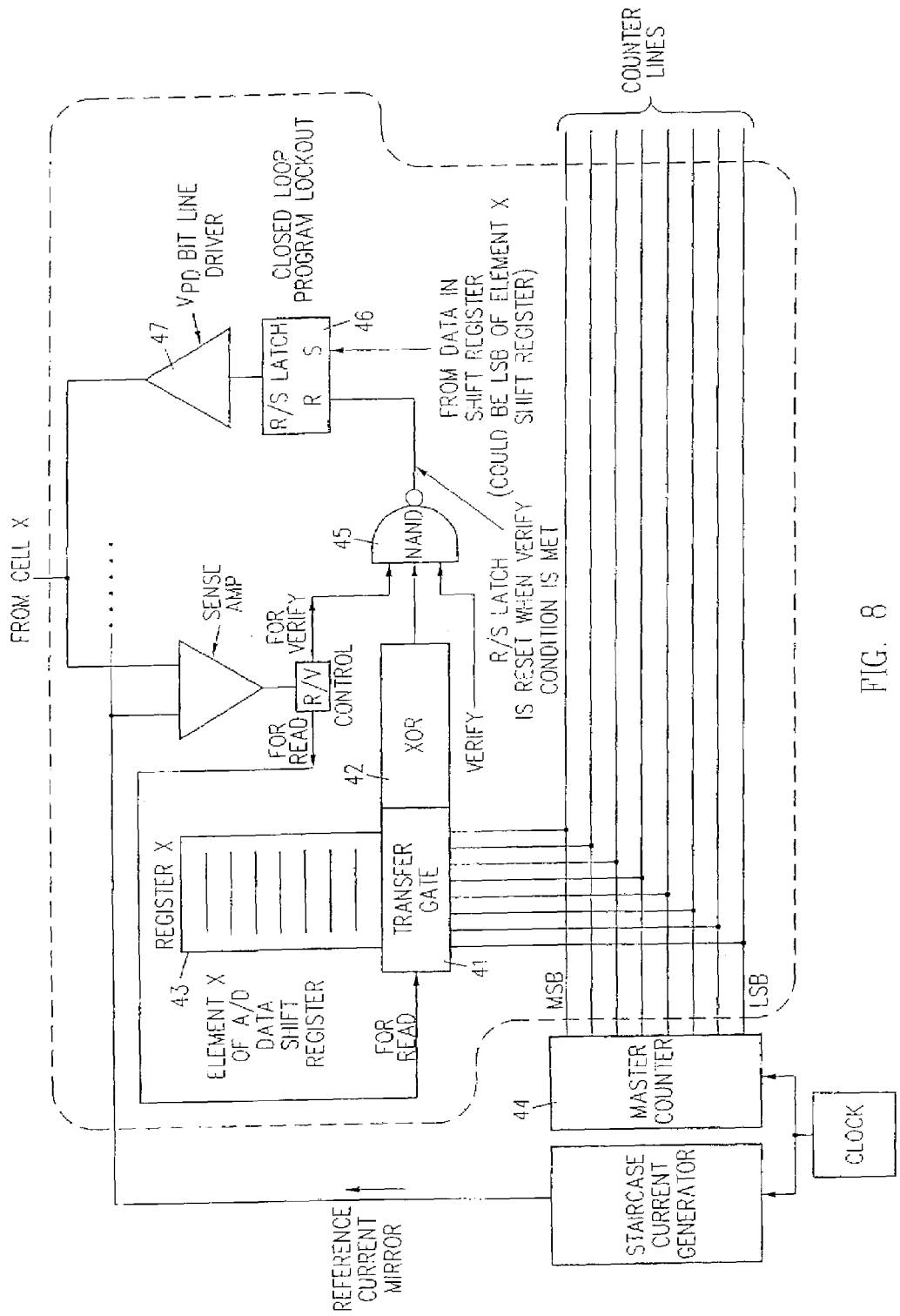
FIG. 8 is a block diagram depicting programming and verification elements suitable for use in the embodiment of FIG. 3.
Figure 9:
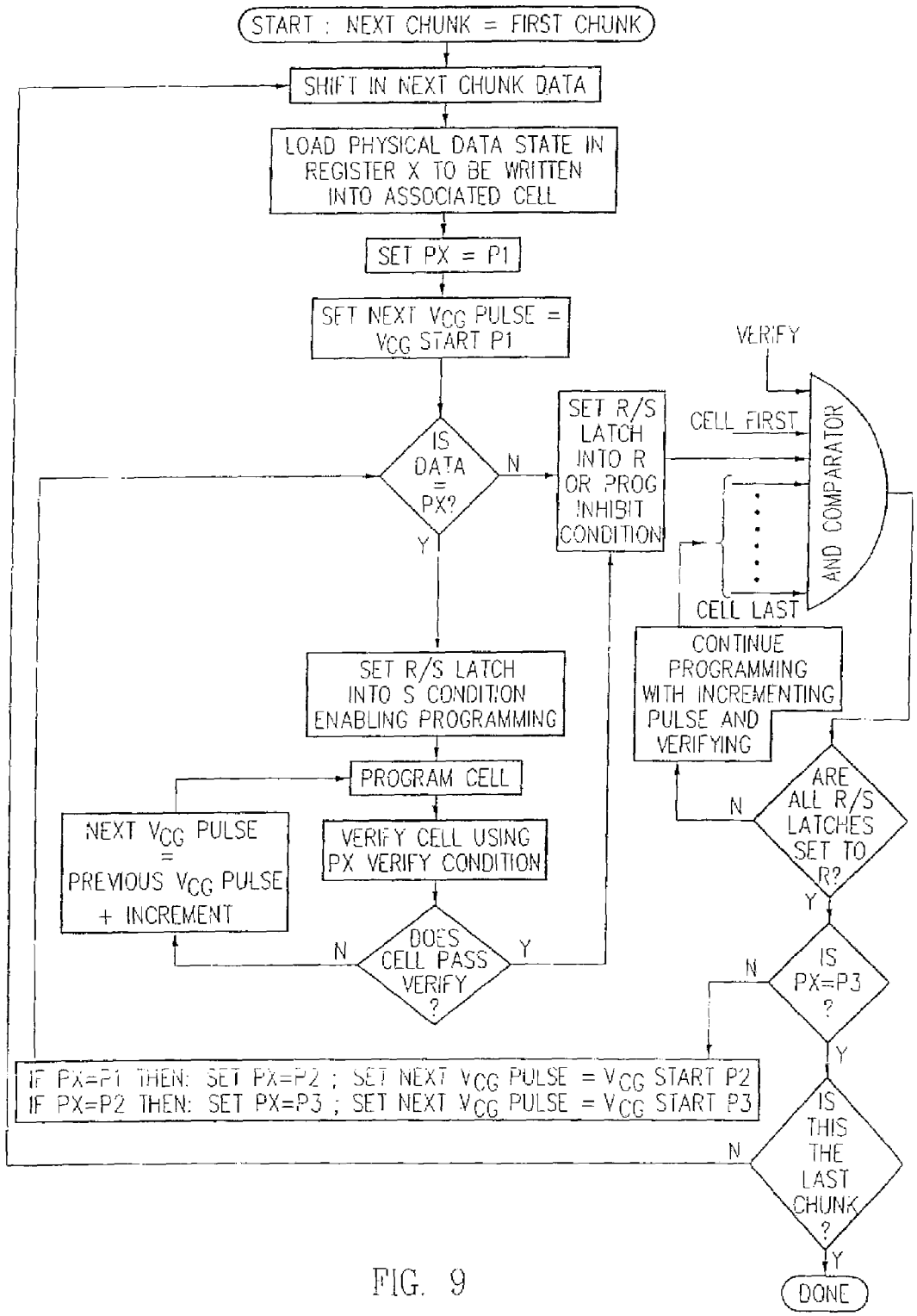
FIG. 9 is a flowchart depicting the operation of one embodiment of this invention as depicted in FIG. 8.

Writing the multi-state data is now described with reference to the exemplary circuit diagram of FIG. 8 and the associated flow chart of FIG. 9. With reference to FIG. 8, the components located within the dashed line indicate components which are replicated for each sector. Following the data unconditional sector erase, data is written into that sector on a chunk by chunk basis. Starting with the first chunk, the first intermediate state, state P1, is placed into the programmed state, which is initiated by using a short, low voltage VCG pulse (for example approximately 4 usec at 2v control gate bias) followed by a verify read against a reference current set at the level appropriate for state P1. For bits within the chunk targeted to receive this programming, but which become sufficiently programmed, an internal circuit locks out further programming of those bits, while targeted cells, still insufficiently programmed, experience the next programming pulse, which is of the same width as the first, but has incrementally higher VCG (e.g. 200 mV higher), again followed by verify. This sequence of programming with incrementally higher VCG followed be verify continues until all state P1 cells targeted within the chunk are verified, or until a maximum VCG is reached (in which case defect management is invoked). Then the next intermediate state, state P2, is written, in similar fashion to the first intermediate state P1, but using the reference current setting associated with that state, and starting with a VCG level appropriate for reliably programming that state in the shortest time. This procedure is repeated for each state until all states in the chunk are programmed and verified, and the whole process repeated on the remaining chunks on a chunk by chunk basis.

Figure 10A:
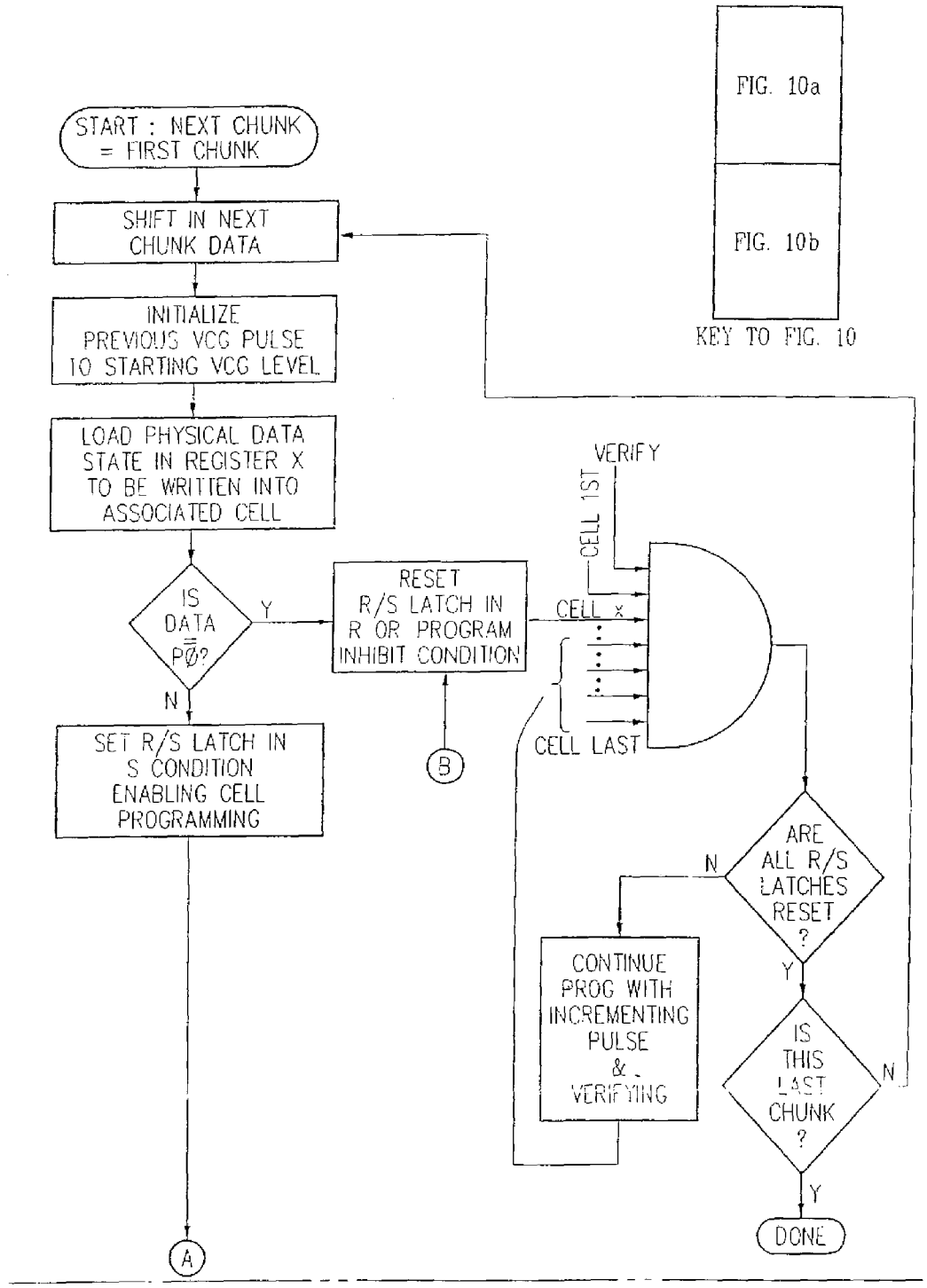
FIG. 10, composed of FIGS. 10a and 10b, is a flowchart depicting an alternative embodiment of this invention suitable for use in connection with the embodiment of FIG. 8.
Figure 10B:
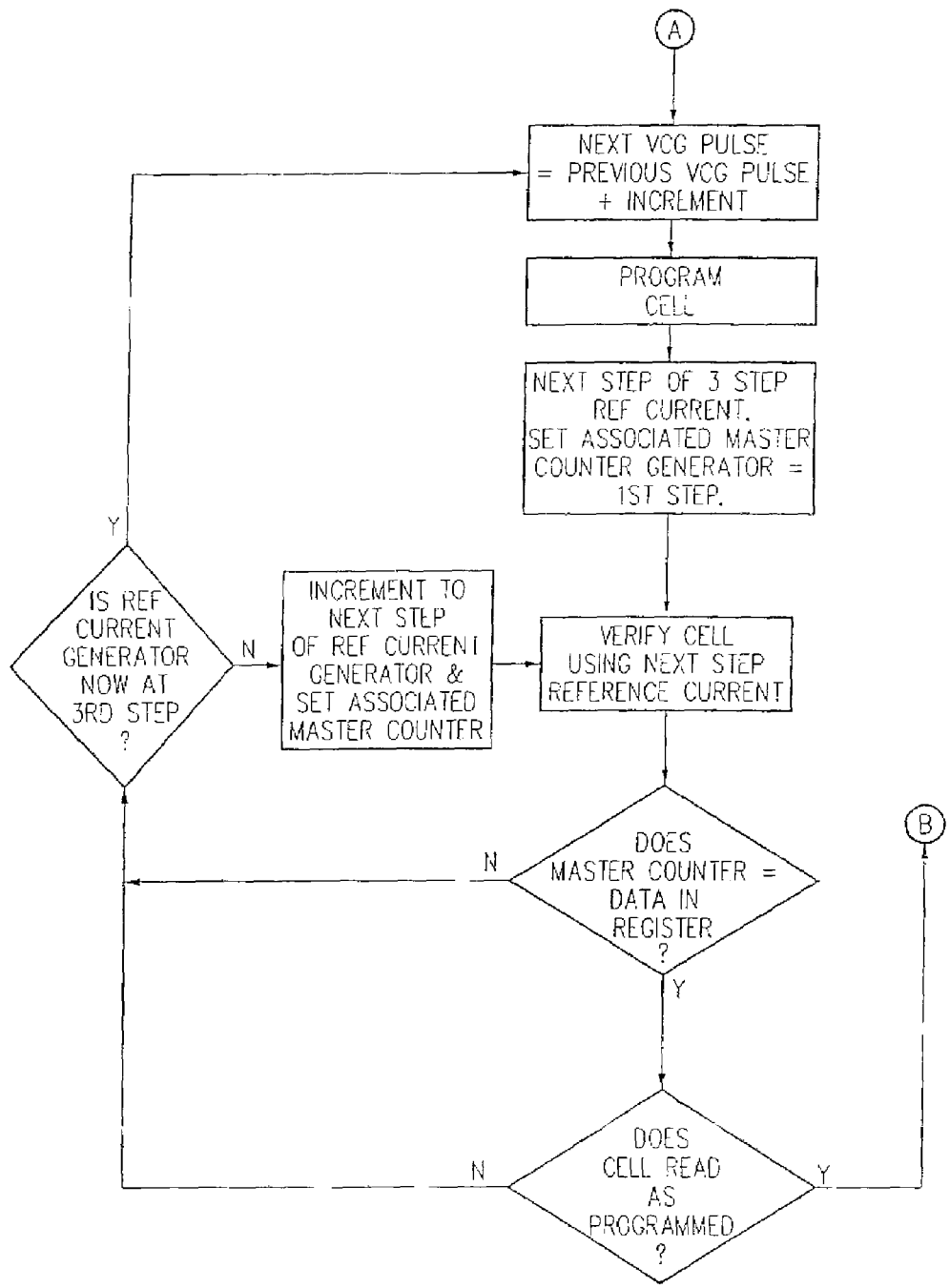

An alternative embodiment, depicted in the flowchart of FIG. 10, provides an increase in speed. In this embodiment all states within a chunk of bits are programmed concurrently in a single VCG staircase progression as follows. The data to be written into the chunk is shifted into the corresponding registers (e.g. register 43 of FIG. 8), exactly mirroring the read-out operation, and the corresponding bit RS latch 46 is set enabling its associated bit line driver. Associated with each physical data state, P0, P1, P2, P3 is its register count and corresponding current level. After each programming pulse the reference current staircase is invoked in analogous fashion to the read operation, with the master counter concurrently incremented. A comparator circuit associated with each register (formed of transfer gate 41 and XOR gate 42) compares the input data (i.e. count) stored in register 43 to that of master counter 44. When a match occurs, the program lockout feature upon verify is enabled. Actual lockout only occurs when the corresponding cell is sufficiently programmed to pass read verify with respect to the associated reference current setting, (i.e. programmed into the associated physical state). Once verify is successful, NAND gate 45 resets RS latch 46, disabling its associated bit line driver 47, and resulting in all subsequent programming of that cell being disabled for the remainder of the sector write operation. If verify fails, the cell will receive the next VCG incremented programming pulse followed again by the scanned current source/master counter verify procedure.

Unlike reading, which calls for use of the entire current staircase to resolve the state to full analog precision, the write/verify operation only needs to use those reference current settings and associated counts specific to the set of memory states, e.g. specific to states P1, P2, P3 as predefined (P0, being the erased state, is excluded and inhibited from programming from the outset), This helps speed up the verify process by having three settings in the case of 4-states, in place of 128 settings exemplified for the read operation of FIG. 4a, where 128 settings allows for quality determinations to be made. Therefore, as illustrated in the example of FIG. 10, each verify consists of a three step staircase operation in which the first step consists of setting up (e.g. rapidly incrementing up to) the first reference current level associated with physical state P1, including concurrently setting up the master counter (e.g. counting) to the corresponding counter value, performing a read/sense operation, and locking out from further programming any cells which both match their register value to that of the master counter and are read as programmed (with respect to the corresponding reference current setting). Each following step of the three step operation consists of setting up (e.g. rapidly counting up to) the next data current level and corresponding reference current setting and repeating the read/sense operation, identically to the first step, until all three steps are completed.

Note that it may not be necessary to have a full match of the 8 bits, only that a sufficient number of MSB (most significant, or of highest current weight bits) match. This is most applicable when there are much fewer allowed states and corresponding cell current targets than resolution of the A/D. In this case, as long as the MSB bits uniquely differentiate each of the various states (e.g. there are a minimum of two MSB bits for 4 state and 4 MSB bits for 16 states) only those MSB bits are required for the exclusive OR. This will save some area associated with exclusive OR circuitry, but does restrict somewhat the current assignment flexibility for each state.

This program/3-step verify procedure is repeated, with VCG incremented in each subsequent program step, until all cells in the chunk are verified or max VCG level is reached, as described previously. This entire operation is then repeated for all remaining chunks of the sector, at which point sector multi-state date writing is complete.

A significant advantage of this novel approach is that it can be extended to a large number of multi-states (e.g. 16) without substantially impacting write performance, other than that required for improved resolution (e.g. more and smaller VCG steps, or lower drain programming voltage VPD, to slow down programming rate), and the additional time needed to sense/verify each of the additional states. The latter, being a read operation, tends to be much faster than programming, and therefore should not substantially impact write performance.

Figure 11:
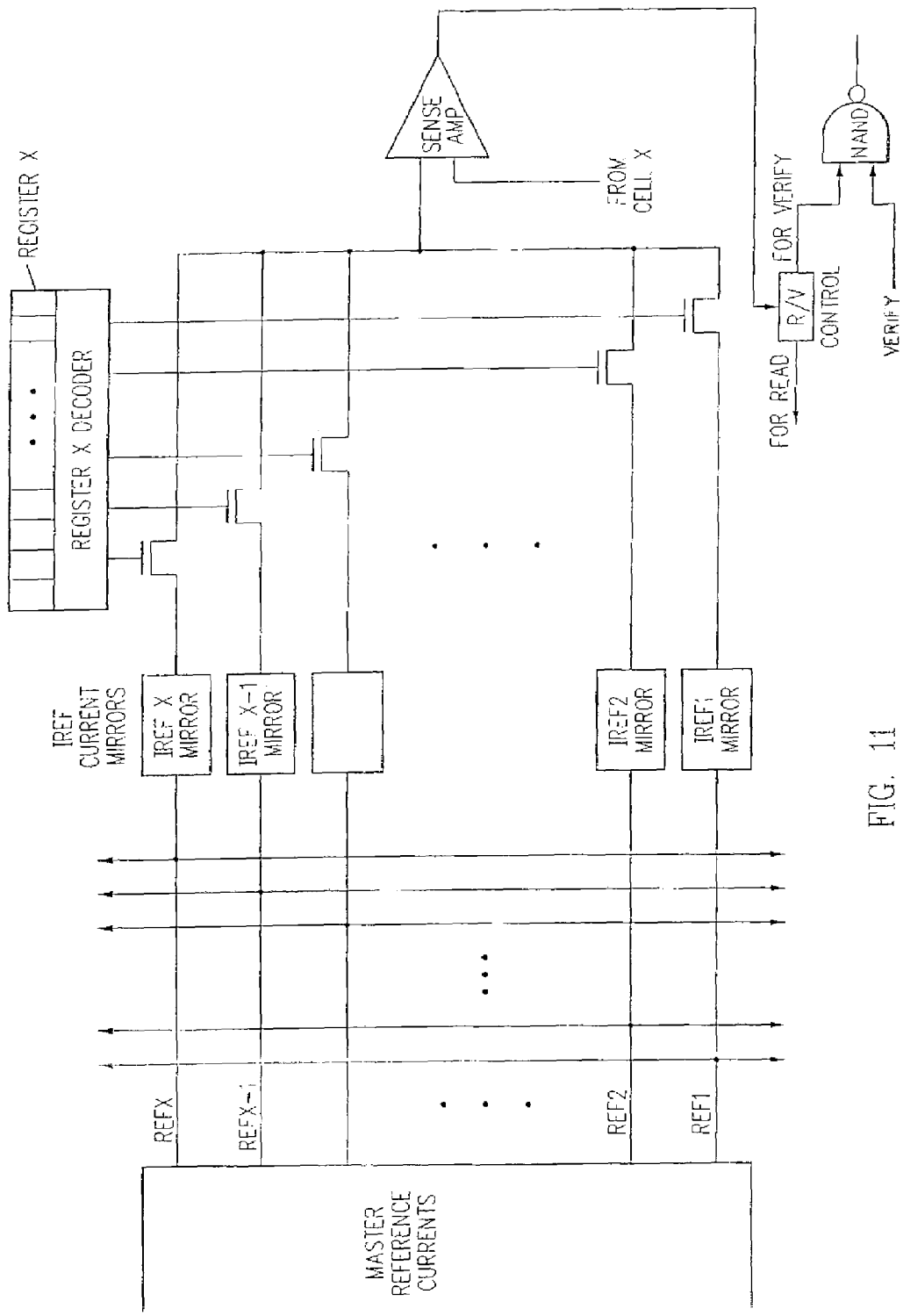
FIG. 11 is an alternative embodiment of this invention which allows for improved verify processing.

An alternative embodiment which speeds up the verify process is depicted in the diagram of FIG. 11. In place of the single adjustable reference current source, multiple current sources (or parallel tap points of a master current source) are used. In one embodiment, the number of current sources is (n−1), where n is the number of states, since a current point is not needed for the fully erased state. A data-in register of size K is used for each cell in the chunk, where $2^K=n$. The information written into the data register by the controller at the start of write is used to select one of the n−1 current levels during verify, dependent on the particular state. Upon verify, all cells of the chunk are compared simultaneously to their corresponding particular reference target in a single verify operation, locking out further programming, on a cell by cell basis, if successful. This allows full verify to complete in one parallel operation, as opposed to the multi-step serial operation in the previously described embodiment, substantially improving verify speed. The cost is the requirement of the multi-current sources, counting and associated selection circuitry within each bit of the chunk. As in the multi-step embodiment, the requirement of data-in register can be served by a portion (e.g. the MSB portion) of the existing readout register. The exclusive OR used in the embodiment of FIG. 8 is now replaced with straight decoding to select the appropriate current source.

Twin-Cell Relaxation Alarm

An additional feature of the adaptive multi-state discrimination sensing of the present invention is the ability to put bounds to extreme states, an upper bound for the highest state (e.g. physical state P0) and lower bound for the lowest state, assuming that this lowest state is not already in cutoff. When the extreme states (as for example reflected within a subset of the tracking cells) cross those bounds, the data is deemed to be outside the limits of safe detectability vis a vis available dynamic range, and sector data either needs to be refreshed (rewritten) or the sector mapped out, replacing it with a spare sector. However, this does not eliminate the need for maintaining a cumulative count of the number of write operations experienced (referred to as "hot count") per sector, since there is no warning at the time of writing that, once written, such excessive shift may occur. Such warning is the function of a "hot count ceiling", to put an upper bound to the amount of cumulative cell wear allowed, forewarning the possibility of excess trapped charge and associated margin loss due to its subsequent detrapping, termed relaxation. If such relaxation exceeds a critical value, the resulting common mode shift of all cells (noting that some form of data state rotation is being used to keep wear on all cells within the sector uniform) within the sector, typically from less conductive to more conductive levels, becomes sufficiently large to prevent discrimination between the highest two states (fully erased state and state just below it); i.e. drift exceeds dynamic range of the system. In order to avoid such failure, sectors cycled to such high trapping levels must be retired.

The hot count is an indirect indicator of such trapping, since in addition to the number of cycles experienced, cumulative trapping is sensitive to other factors such as duty cycle of the write operation, time between writes, operating and non-operating temperature exposure, etc.; i.e. history/details. When hot count is used as criteria for mapping out a sector, it must assume worst case conditions to insure no failure. However in practice, systems using such memories rarely, if ever, experience such worst case history exposure under actual application. Therefore, mapping out of a sector based on cumulative hot count is often excessively premature for practical applications.

An alternative embodiment uses a "Twin-Cell" trapping gauge included within each sector, whose function is to detect directly the amount of channel trapping shift which is responsible for the relaxation. This provides a direct measure of the amount of wear actually seen by cells in the sector, comprehending both cumulative write cycles or hot count and history of sector exposure. Only when this cell's shift reaches a critical value will the sector be retired, and no hot count information is required to make this decision. This allows much higher endurance capability in actual system use than can be safely provided via hot count because, unlike hot count which can only provide a general indication of cumulative wear (since it cannot gauge wear directly, only exposure), and therefore the hot count must be heavily guardbanded (i.e. allowing minimum number of writes to accommodate worst case wear), the twin cell's direct measure of wear can minimize the amount of such endurance guardband.

Figure 12:
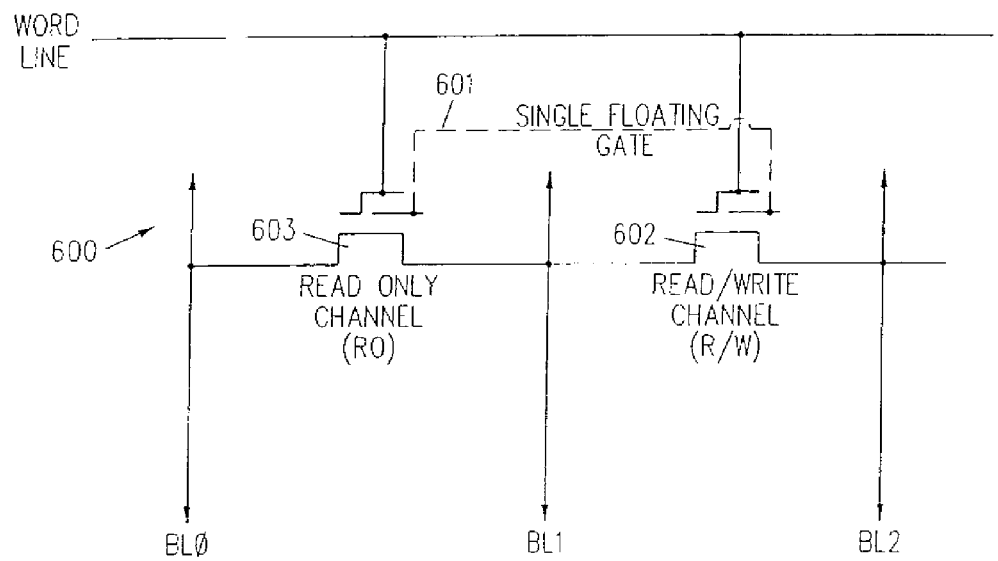
FIG. 12 is a diagram depicting one embodiment of a twin-cell of the present invention.

One embodiment of a Twin-Cell of the present invention is depicted in FIG. 12 and, consists of a cell 600 having a single floating gate 601 but two separate sensing channels, one channel 602 being a read/write channel (MN), the other channel 603 being a read-only (RO) channel. Cell 600 is designed to match actual memory cells, e.g. by taking two adjacent memory cells and tying their floating gates together. Programming of cell 600 is performed through the read/write channel by raising bit line BL2 to a programming voltage (for example about 7v), and grounding bit line BL1, while bit line BL0 is floated (or grounded). In this way, all the stress and trapping associated with hot electron programming is confined to the read/write channel 602. Using the AND read of read/write channel 602 followed by A/D reading of read only channel 603 and finding the difference (e.g. by subtracting) gives a measure of channel trapping (delta). Early in a sector's life, with low cycling exposure, this delta is close to zero, while with progressive cycling the difference grows, with the read only channel 603 giving higher A/D counts (appearing more erased) compared to read/write channel 602.

The state set and used for useful comparison is, in one embodiment, a middle intermediate state, offering both the widest range and the average wear of a cell. When the delta exceeds a critical value (e.g. 20 counts in example of FIGS. 5a and 5b, corresponding to a cell current shift of 20 uAmps and 10 uAmps for the four and eight state encoding, respectively) the sector is at its limit with respect to wearout/relaxation or other potential read and reliability problems and is retired.

In summary, key points described thus far in this specification for supporting high density multi-state are:

1. Parallel, full chunk, AD conversion of multi-state data, with adequate resolution to provide analog measure of the encoded states;

2. Master reference cell(s) whose prime function is to provide optimum dynamic range for comparator sensing;

3. Logical to Physical Data scrambling to provide both intra-sector wear leveling and increased endurance capability of about twofold.

4. Intra-sector tracking cell groups, one for each state, included in each sector to provide optimum compare points for the various states, and able to adapt to any common mode shifts (e.g. relaxation). It also provides translation of data rotation.

5. Controller incorporating a data processing "engine"
   a) to, on-the-fly, find midpoints of each tracking cell group,
   b) with which to establish data state discrimination and marginality filter points,
   c) through which sector data is passed, giving both the encoded memory state, and its quality (marginality), for each physical bit,
   d) optionally, to decide what actions must be taken to clean up (scrub) marginal bit data based on the quality information (e.g. do full sector erase and rewrite versus selective write, only).

6. Optionally to include a small counter on each sector which is incremented each time a read scrub is encountered. When the count reaches maximum allowed, marginal bit(s) are mapped out rather than rewritten and counter is reset to 0. This provides a filter for truly "bad" bits.

7. Same means are applied in reverse to write multi-state data back into a sector, using the same circuitry as used for read but operated in reverse, to provide self-consistent data encoding. In addition, two alternative embodiments for performing verification are taught:

7a. Using a reference current staircase to sequentially scan through the range of states, conditionally terminating each cell as the current step corresponding to its target data is presented to the sensing circuit.

7b. Using a full set of N−1 reference currents of the N possible states to simultaneously verify and conditionally terminate all cells.

8. Twin-cell option can be included in each sector to provide deltaVt shift level associated with cycling driven trapping and channel wearout, triggering sector retirement before detrapping shifts exceed read dynamic range or other potential read errors. This replaces hot count based sector retirement, greatly increasing usable endurance.

Enhancing Multi-State Speed by Utilizing Column Oriented Steering

An important goal for multi-state is achieving competitive speed to two-state devices, with respect to both write (data programming) and read. The reason that maintaining comparably high performance is difficult for multi-state, as compared to binary encoded data, originates from the considerably tighter margin requirements associated with multi-state encoding (given a limited total memory window budget), coupled with the fact that the information content per cell increases only logarithmically for a linearly increasing number of multi-state levels (i.e. $2^n$ levels gives only n bits of information). So along with margins, performance becomes a victim of the diminishing returns associated with increasing levels of multi-state.

In the embodiment discussed above with reference to FIG. 10, write performance is heavily impacted by having to progressively and carefully go through each state, the progression requiring a sequential, multiple pulse/check methodology to carefully set the state, although in several embodiments verification speed can be increased, as discussed above. For example, to implement 4-state: erase sets up physical state P0; a first VCG staircase of up to 7 pulse/check steps sets up physical state P1; followed by a second group of up to 6 pulse/check steps to set up physical state P2; terminated with a last programming step to set up physical state P3; giving a total of 14 pulses to write two bits of information, 7 pulses per bit, in place of the one pulse per bit for writing binary. Projecting this to 8 level multi-state, the total number of pulses would be more than 30, a further slowdown to more than ten pulses per bit.

Thus far, read performance has not been impacted for two reasons. The first is the feature of concurrent multi-state sensing using multi-leg cell current mirroring to n−1 sense amps (e.g. three sense amplifiers for 4-state). The second is the stream read feature appropriate for mass data storage, wherein, other than latency, the actual cell read time is hidden by the stream read implementation which simultaneously shifts out a large chunk (e.g. 256 bits) of previously read data while current data is being sensed.

For more aggressively scaled multi-state implementations, both of the above features will become inadequate With respect to the first, the use of static current sensing becomes increasingly unattractive, both because of increasing IR drops with physical scaling and increased memory window requirements while sensing margins decrease, and because of the higher power consumption associated with high value multiple current levels. A more attractive way to sense multi-states is via voltage margining, which requires only minimal cell current (as for example using dynamic type sensing), but dictates stepping through the range of control gate voltage margin levels spanning the states (for n states, this means a minimum of n−1 steps), an example of which is given in the above referenced analog dynamic-type sensing embodiment.

This impacts the stream read feature however, because now the time consumed in actually stepping through the various margin levels, followed by sensing, increases greatly. When combining this with progressive demand for higher-still data rates in mass storage, it will become increasingly difficult to exploit stream read to achieve enhanced performance. In addition, write performance can also be significantly impacted by internal read speed limitations, since read is an integral component in reliably setting the individual states (via program/verify loops), as well as for post write sector data checking.

So with more aggressive use of multi-state for scaling, based on the above scenario, performance will continue to decline. The above referenced analog sensing embodiment improves performance by supporting a large degree of parallelism. Greater parallelism is one way to retard the decline in performance associated with increasing numbers of cell states. However, the use of a virtual ground array (imposing a separation between simultaneously addressable cells) plus the constraint of a 512 byte sector size granularity, places a limit on how far parallelism can pushed.

The embodiments of this invention described in the following section offer a solution to the above performance limitations, by substantially cutting down the number of discrete steps required for both programming and read, while preserving the desirable features associated with analog/voltage margin sensing taught by the present invention.

Given that a dominant controlling element allowing differentiation between the various multi-state levels is the control gate (or equivalently termed steering gate), the key to reducing the number of discrete steps used for both read and write is to simultaneously apply, to the full group (chunk) of cells, control gate voltage values associated with each cell's particular data state requirements, on a cell by cell basis.

Figure 13:
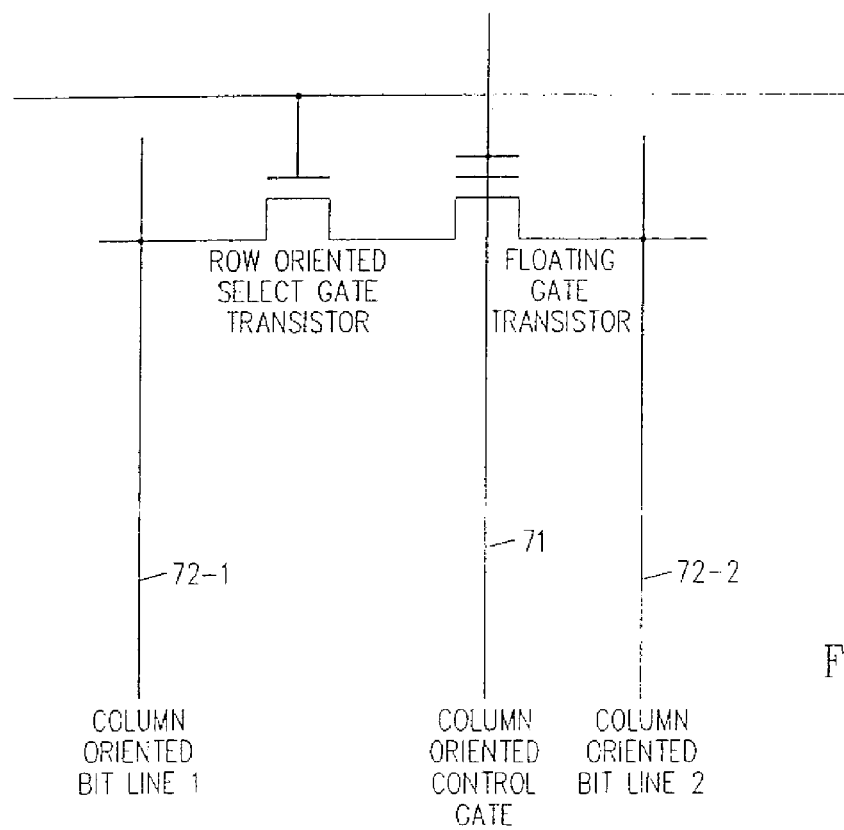
FIG. 13 is a diagram depicting one embodiment of a cell suitable for use in connection with certain embodiments of this invention.

In a row oriented sector, in order for the control gate to be individually adjustable for each cell, it cannot run in the row line direction, since it then becomes common to all cells which are to be simultaneously operated on. Rather, it needs to run in the column (bit line) direction, which allows it to both be individually adjustable on a cell by cell basis, and individually responsive to the sensing result on the associated cell bit line. The basic elements of one embodiment of such a cell are shown in FIG. 13. Since control gate 71 runs parallel to bit lines 72-1 and 72-2, control gate 71 cannot also serve as the select line (which is the usual case in EPROM and FLASH memories), since unique cell selection along a bit line dictates that the select line run perpendicular to the bit line. This forces the select line to run in a different layer, which in one embodiment is a poly3 line with the control (steering gate) being a poly2 line and the floating gate built from poly1. Specific exemplary embodiments of cell structures suitable for use in conjunction with this aspect of the present invention are described later.

Cell Read Operation

Figure 14:
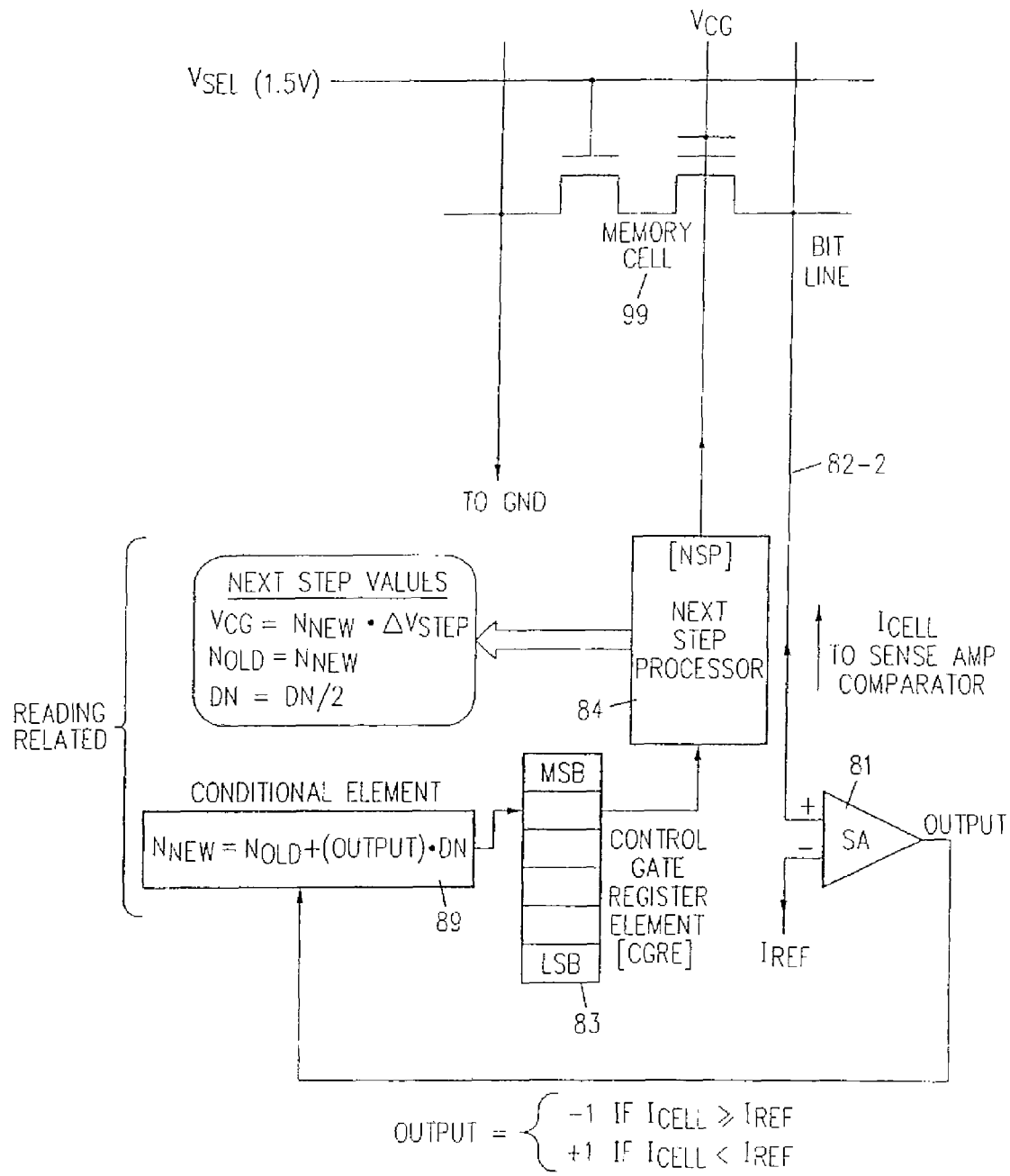
FIG. 14 is a diagram depicting one embodiment of the cell-read operation of this invention using the cell embodiment of FIG. 13.
Figure 15:
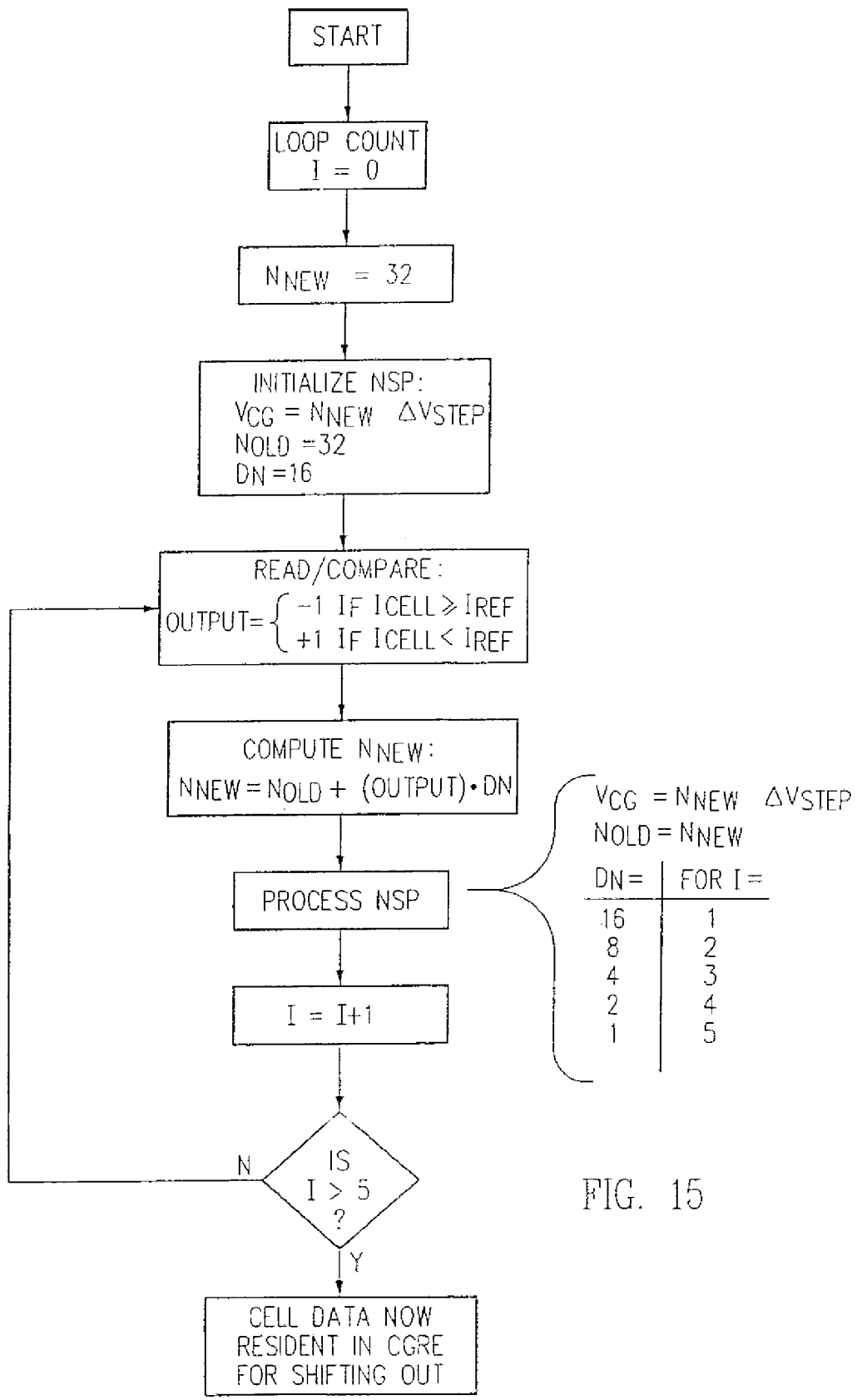
FIG. 15 is a flowchart illustrating one embodiment of this invention with reference to the embodiment to FIG. 14.

A cell as in FIG. 13 is read using the control gate in an A to D type binary search, as illustrated in the exemplary embodiment of FIG. 14, and the flowchart of FIG. 15. Each sensing circuit consists of Sense Amplifier (SA) comparator 81, having one input lead which receives an input signal from memory cell 99 via bit line 82-2, and another input lead receiving an input signal from a global reference circuit (not shown) which provides reference signal Iref. The output of comparator 81 is used to update a corresponding n-bit Control Gate Register Element (CGRE) 83, the number of bits governed by required sensing resolution (e.g. if a 1 in 64 resolution is desired, a six bit register is used). The value stored in CGRE 83 is then used to provide the next control gate read VCG voltage, via the corresponding Next Step Processor (NSP) 84, in a successive approximation scheme.

Following is an example of the read operation flow, as depicted in the flowchart of FIG. 15. CGRE 83 is a 6-bit binary register element, with a corresponding dynamic range on the control gate (via NSP 84) of 0v to 7.875v in 125 mv steps. Read starts with the binary value 100000 (Nold) loaded into the CGRE, giving the midpoint VCG of 4v. The output from sense amp 81 is then fed back into control gate register 83, via Conditional Element 89, according to the relation:

$$Nnew = Nold + Output*DN;$$

where (for flowcharting convenience) Output is defined as:
 −1 if Icell>=Iref, and
 +1 if Icell<Iref;

and where DN=010000, giving next CGRE (or VCG) of:
 010000 (or 2v) if Icell>=Iref, and
 110000 (or 6v) if Icell<Iref.

In this way, if cell current is higher than Iref, the next VCG will be lower, reducing the cell current. Along with this next VCG, the next Nnew=Nold and the next DN=DN/2 are generated by Next Step Processor 84. This binary search continues five more times (for a total of 6 passes), wherein the last COGRE 83 value becomes the digital equivalent of the floating gate memory state. If the memory cell uses an 8-level (three logical bits/cell) multi-state encoding, this gives three bits of resolution between states for state-to-state discrimination, guardbanding, margining, etc. Data can then be processed in ways similar to those described in the afore-referenced Analog Sensing embodiment, the difference here being the rapid binary search methodology (as opposed to one-step-at-a-time sequential search), which for 1 in 64 bit resolution represents a 10× performance improvement (six steps in place of a possible total of around 64 steps).

Figure 16:
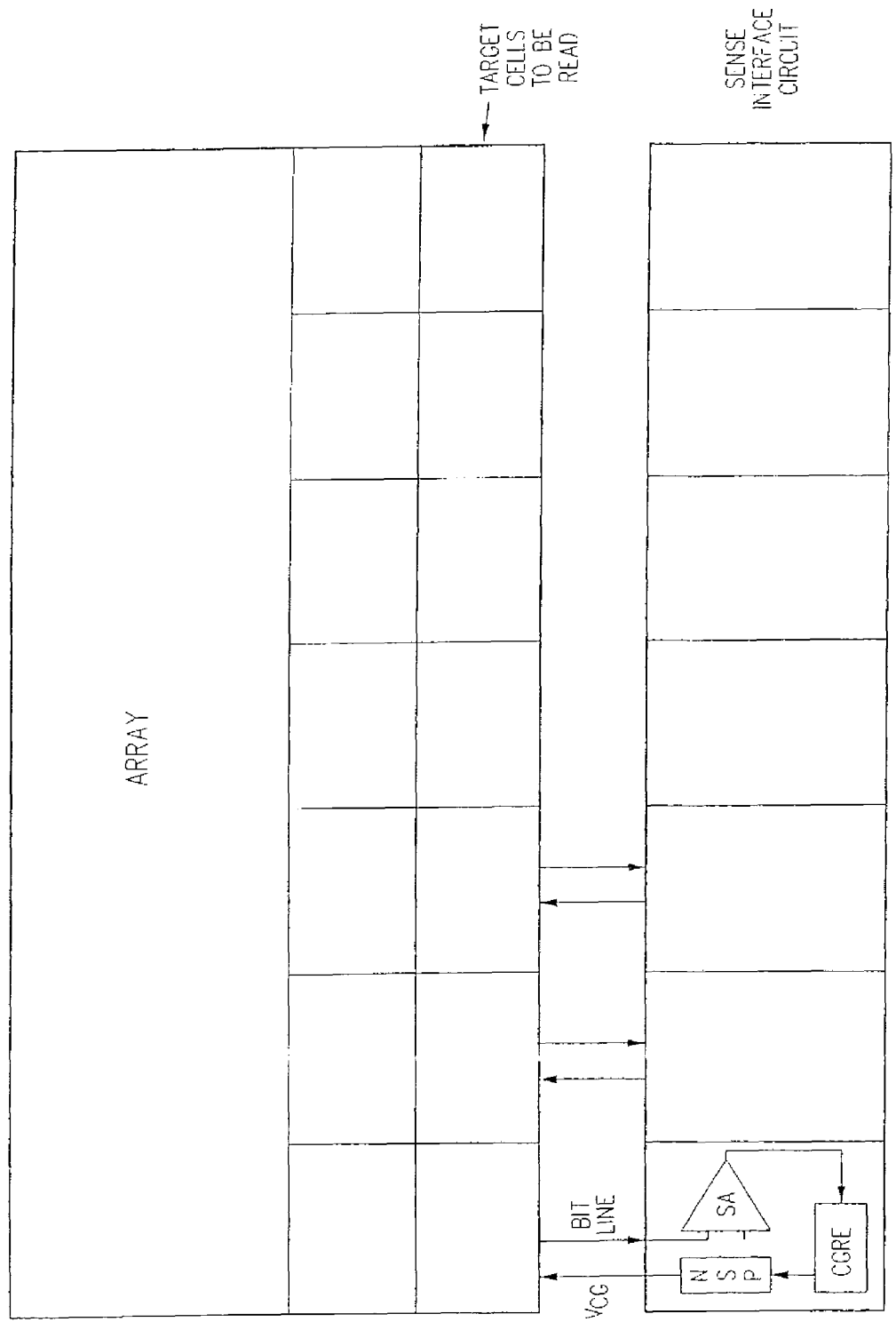
FIG. 16 is a diagram depicting an alternative embodiment of this invention in which sensing is performed on a plurality of bits simultaneously as could be used in conjunction with the embodiment of FIG. 14.

In one embodiment, sensing is extended to a full chunk of bits (e.g. 128 bits per chunk), wherein each sensing circuit contains its own corresponding SA, CGRE, and NSP elements, as is depicted in the embodiment of FIG. 16, in which the operation of each sensing circuit is conditional on its corresponding memory cell. In this way, the strength of the binary search approach is exploited to recover most of the lost read performance. For example, comparing the above example to a two-state read, assuming that each individual step of the binary search takes a comparable amount of time as that of the two-state sensing, then the total time expended in the multi-state read is equal to 6 binary reads. For 8-state encoding, three bits of information are extracted, resulting in a read time per logical bit of only twice that of binary state reading. Given that margin information is concurrently available as well (as described above), this offers an excellent level of read performance, consistent with a stream read implementation.

Cell Programming Operation—Programming Phase Specific

Figure 17:
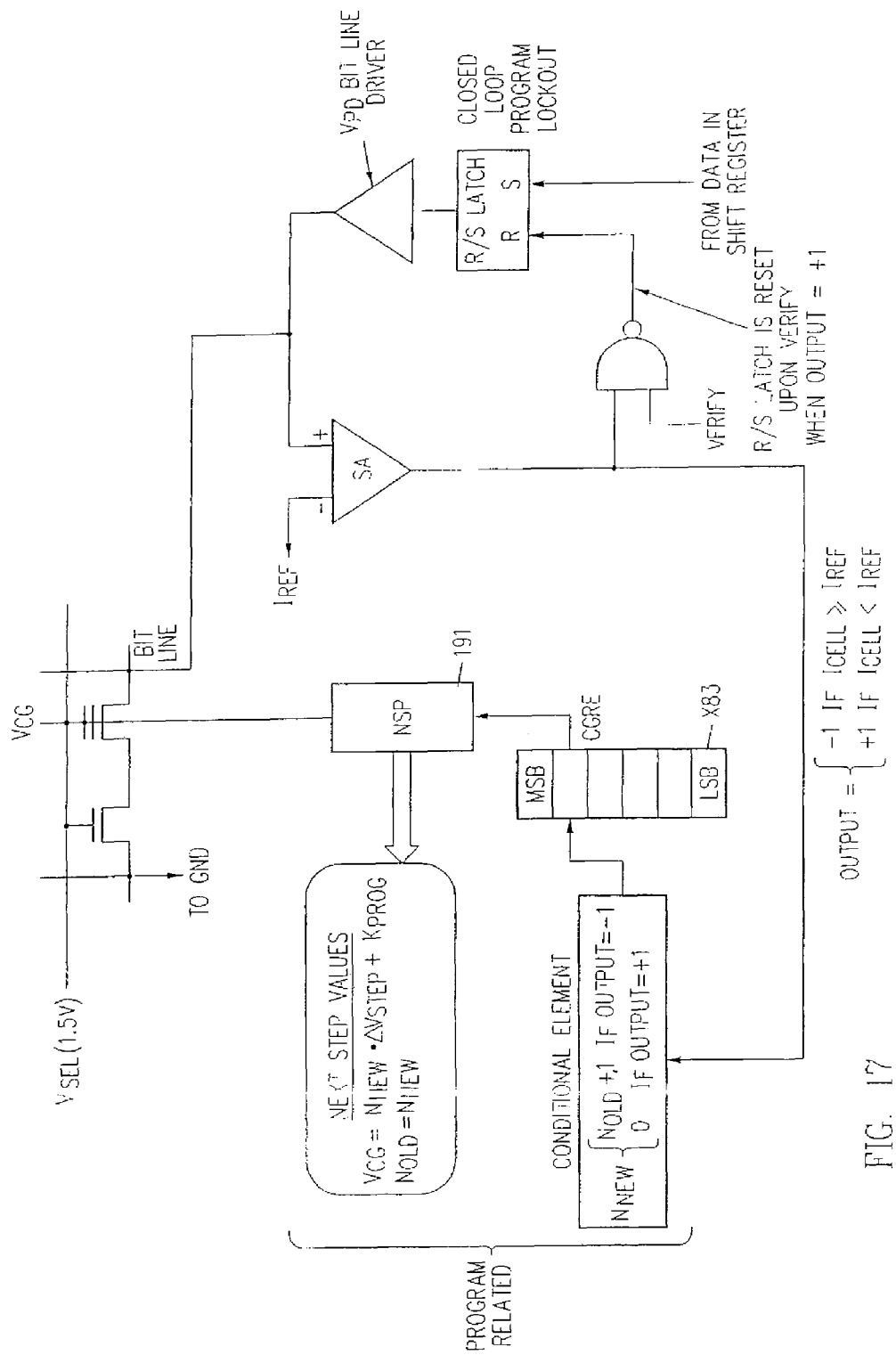
FIG. 17 is a diagram depicting one embodiment of this invention in which common elements are used for both reading and multi-state programming.

In certain embodiments, the same elements used for reading are also applied to accelerate multi-state programming, again optimized to the targeted memory state on a cell by cell basis, as illustrated in the example of FIG. 17. Here, the CGRE X83 is initialized with the optimum safe starting value for the particular state (this may come from a set of updatable parameters stored within the sector). In memory cells whose magnitude of programming (e.g. programming Vt) increases with increasing VCG, this optimum safe starting point is the highest value of VCG allowable that will not cause the memory cell to program excessively, overshooting its targeted state (i.e. overshooting its allowed state range). Starting at lower values than this optimum value, while safe, costs more programming time, because the earlier programming pulses do not provide a sufficient magnitude of programming towards the targeted state, thereby decreasing write speed. In one embodiment, a different relationship of VCG with CGRE from that of read is used to satisfy dynamic range for programming (e.g. by adding constant voltage Kprog as indicated in the exemplary embodiment of FIG. 17). Following each programming pulse, a verify operation is performed. In the class of cells described above, if programming margin target is not achieved, the CGRE value is incremented by 1, with a corresponding incremental voltage increase on VCG via NSP element 191 for the next programming step, whereas if margin is reached, further programming on that bit is locked out, by disabling further application of programming voltage on its associated bit line and optionally eliminating application of VCG as well.

In one embodiment, this operation is performed simultaneously on all bits within the chunk, each bit starting at its optimal VCG, conditional on its corresponding to-be-programmed data. In this way, programming is completed in about six steps, relatively independent to the level of multi-state (e.g. 4, to 8, or 16 level multi-state cells are, in accordance with this embodiment, programmable in a comparable number of pulses), in place of the more than 30 programming steps indicated earlier for a fully sequential 8-level multi-state programming embodiment. This not only represents a 5× write speed improvement, but given that three bits are being encoded, this gives an effective number of programming/verify passes of two passes per bit, only twice that of binary encoding. Since performance of a full write operation includes additional time overhead above and beyond program/verify, this smaller difference in program speed may translate, in practice, to only a minor reduction in overall write speed as compared to binary encoded writing.

Cell Programming Operation—Verify Phase Specific

Cell verify can also be made state specific, using the same CGRE/NSP engine described above with reference to FIG. 17, by loading the targeted verify voltage (i.e. that value corresponding to the to-be-programmed data) into its associate CGRE. In this embodiment, unlike the read operation, for which VCG is changed during the read binary search flow, during the verify operation the state specific VCG verify voltage is kept fixed during the full program/verify flow (i.e. NSP for verify remains unchanged). In this way, all cells within a chunk are verified simultaneously, with further programming locked out, on a cell by cell basis, as each cell passes the verify operation.

Figure 18:
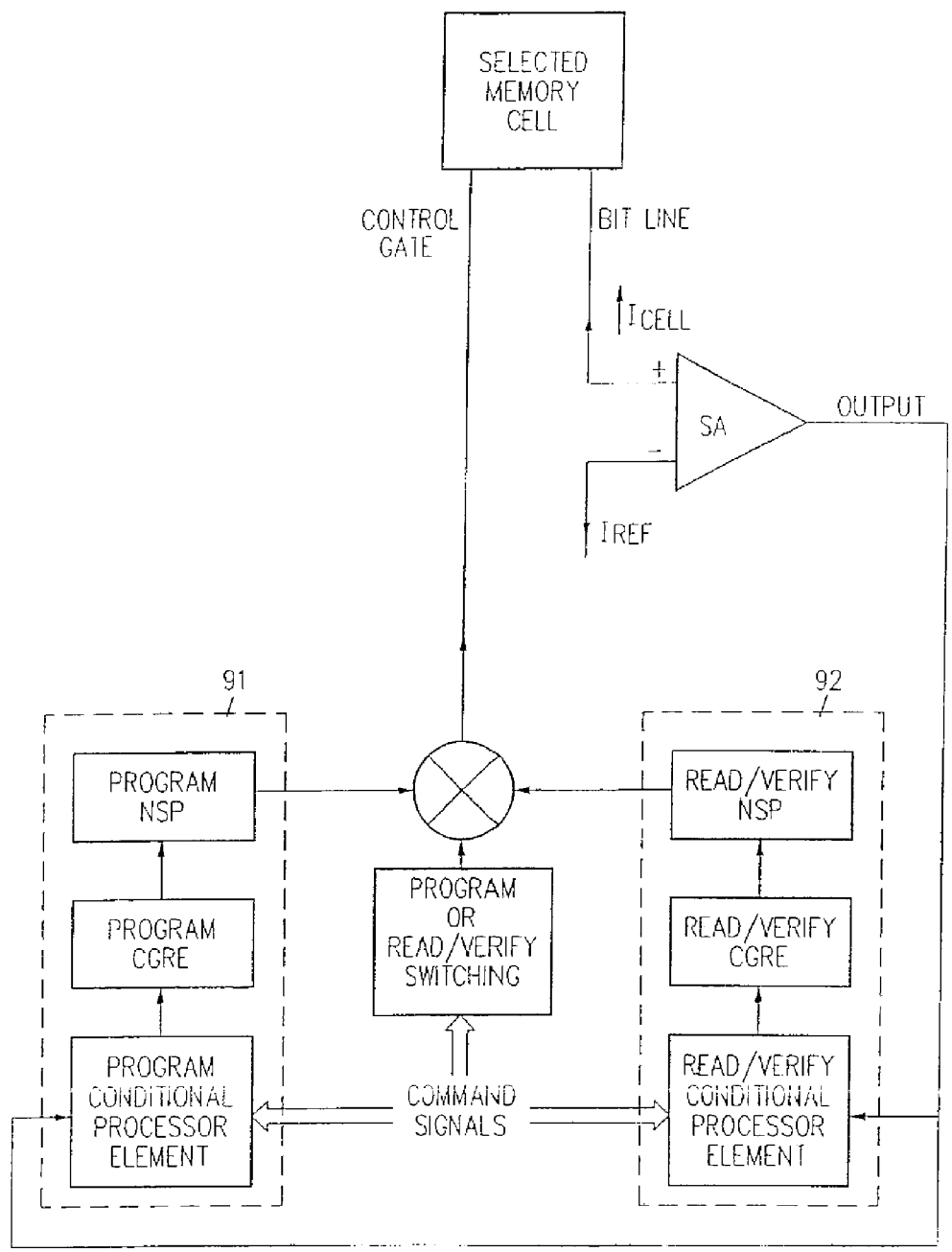
FIG. 18 is an alternative embodiment of this invention in which certain control elements are replicated, one set used for programming and the other for read/verify operations.

This data conditional, high performance verify embodiment complements the above described high performance, data conditional programming embodiment, offering a highly parallel, fast speed methodology for setting a many level multi-state memory. In one embodiment, in order to better exploit this capability, two different CGRE/NSP circuits are used, as illustrated in FIG. 18. CGRE/NSP circuit 91 is used to support programming, and CGRE/NSP 92 is used for verify, allowing these two circuits to be multiplexed at high speed onto the control gate when changing between programming and verify operations.

Although using the individual, cell by cell VCG supply as in this embodiment, offers an excellent approach to supporting a high level of multi state at high speed, it puts the burden on quickly providing all these VCG voltages. In one embodiment, all the possible voltage steps are generated and available simultaneously on a bus of voltage feed lines. In this embodiment, each CGRE value is used to decode which one of these feed lines to connect to its corresponding control gate. This embodiment is attractive when there aren't too many VGC levels to manage. Since in principal only seven compare points are needed for discriminating 8 states (and only 15 compare points are needed for discriminating 16 states), this will often be suitable. However, this limits the high speed flexibility to dynamically tune the sense points and determine margins. If the need for attaining such full resolution is very rare (as for example when ECC indicates a memory state failure or a marginality problem), an alternative, hybrid embodiment is provided which only demands such capability rarely (e.g. on the rare ECC flag). On those rare occasions, those compare points are incrementally shifted to fully resolve the margins, albeit via a more time consuming procedure, because now voltage values will need to be provided which are not included in the limited set of supply levels (e.g. 7 to 15 levels) concurrently available. This would dictate temporarily generating new voltage levels, not concurrently available, consuming more time, and potentially breaking up the concurrent parallel chunk operation into operations on individual bits or small groups of bits to feed these specialized voltage levels.

In the case where a large number of VCG voltage possibilities and/or all VCG voltage possibilities are required (i.e. full real-time margining capabilities for full dynamic range flexibility), one alternative embodiment, similar to the embodiment of FIG. 17, expands the CGRE X83 and NSP 191 elements to include sample-and-hold circuitry for each sensing circuit, the complement of which are fed by a common, single staircase voltage source. The voltage delivered by each NSP is conditional on its corresponding stored CGRE value. Care must be taken in such an embodiment to ensure that the dynamic nature of sample and hold circuitry with its potential for drift, and the time requirements for scanning/sampling the full dynamic voltage range, do not cause programming voltage Vpg error. The benefit of this embodiment is that it incurs less area and power penalties.

It is desired to simultaneously process each of the CGRE data, based on the associated sense amplifier result and the previously stored value (as well as the step in progress in the case of read), conditional on the operation in progress. This is most complex for read, involving the manipulation for successive approximation (basically providing up/down counting function, conditional on sensed result and current iteration step). For programming and verify its requirements are simpler, complexity coming primarily in initializing each of the CGREs to the corresponding data values; once initialized, nothing further is required for the verify, requiring only incrementing by one for each successive programming/verify step in the case of programming. Notwithstanding these complexities, required circuit areas and complexity of circuits should not differ substantially from approaches which use multiple sense amplifiers. The prior art approach uses multiple sense amplifiers (e.g. requiring up to seven sense amplifiers for 8-level multi-state). In accordance with this embodiment, the multiple sensing circuits and associated current mirrors and reference legs are now replaced by one sense amplifier circuit, a couple of registers with associated decoder functions, sample and hold circuits, and some glue logic.

The other major element of complexity is that of shifting out and processing the large body of data stored in the chunk-wide CGRE register One embodiment used is similar in this regard to that described in the above-referenced analog sensing embodiment.

Exemplary Cell Embodiments

Firstly, independent of other considerations, a memory cell must be competitive with respect to physically small size and scalability. Beyond that, however, based on the cell requirements described above for a row selectable but column steerable element, as represented in the example of FIG. 13, the choices are limited.

Furthermore, in order to realize such a cell/array in minimal area, it must incorporate virtual ground architecture, and this is not just because of the approximately 50% additional area associated with using the conventional ½ contact per cell array. The joint requirement of bit line and steering line running in the same direction, with the bit line having to physically run above yet periodically dropping below the steering line to contact diffusion, dictates that they run side by side rather than be stacked. Whereas this occurs naturally in the virtual ground array, wherein active transistors are laterally displaced from the bit lines, in the conventionally contacted cell array the active transistors, while displaced from the bit line contacts themselves, do lie directly below the bit line conductor. For this reason, select/steering functions in such arrays are generally row oriented, eliminating the conflict. To do otherwise further increases cell area.

One memory cell which meets all the above requirements is the virtual ground, split gate cell having column oriented poly2 steering gates and row oriented poly3 select gates. For reference purposes this will be referred to as cell embodiment 1. Such a cell can be programmed using either conventional drain side programming, or source side programming, depending on whether the poly3 select transistor is strongly turned on or throttled down, respectively. Erase is also row oriented, using poly3 as the erase line, thereby achieving the row oriented sector. The source side programming version of this is described in U.S. Pat. No. 5,313,421, assigned to Sandisk Corporation. For reference purposes, this version will be referred to as cell embodiment 1a.

Another suitable cell is the dual floating gate variant of cell embodiment 1a, such as is described in copending U.S. patent application Ser. No. 08/607,951 filed Feb. 28, 1996 and assigned to Sandisk Corporation, which offers a true cross-point cell (4*lambda$^2$ per physical bit). For reference purposes this version will be referred to as cell embodiment 2. However, because of the series nature of the tri-gate structure (the two floating gate channels being in series), it is constrained to using source side programming, and will be more limited in how many levels of multi-state are realizable. Nevertheless its inherently smaller cell size, self-alignment features and consequent scalability make it equally attractive to the simpler but somewhat larger cell embodiment 1a.

Column Pitch/Segmentation Options

Because of the requirement within each cell to have both bit line and steering line (control gate) running parallel to each other (for convenience, their direction henceforth defined as vertical), this raises the question of bussing/pitch requirements. To achieve a physically minimal cell, this dictates that the lateral extent (horizontal width) of the cell must be close to minimum feature pitch (i.e. about 2*lambda), forcing the above two lines to fit in that pitch. At the cell level this is not a problem, since the steering line and bit lines tend to run side by side, and more importantly they are on different layers (poly3 and BN+, respectively) eliminating proximity/overlay constraints. However, going from the local to the global interconnect level is a challenge.

For ultra high density Flash memory, one way to interface long bit line columns to the memory cell array is via column segmentation. This approach uses the continuous (vertically) running metal lines as global bit lines, which drop down periodically to local diffusions serving memory sub-arrays or "segments" (e.g. 16 sectors) via segment select switching transistors. In this way array segments are isolated from one another, eliminating the large cumulative parasitics of leakage current and capacitance, and providing column associated defect and repetitive disturb confinement. This also provides opportunity for relaxing the pitch requirement of the global bit lines from one per cell to one per two cells, depending on the segment selection approach used (e.g. U.S. Pat. No. 5,315,541 assigned to Sandisk Corporation).

With respect to the steering line, first consider the cell/array using cell embodiment 1, which requires one steering line per column of cells. One possibility is to have this be a continuous global line, i.e. running continuously (vertically) through the entire memory array. Running through the memory cell sub-array portion poses no obstacles, readily fitting within the existing pitch. However, it may run into obstacles when trying to cross the segment select portions, which bound those sub-arrays. Other issues with this approach are the associated large RC time constants (impacting speed of charging and discharging a long, resistive line), and the increased array exposure to repetitive disturb.

For those reasons, segmentation is also desirable for the steering function. Consequently, given that at most one metal line can be run in the pitch of one cell, both global metal bit lines and global steering lines can be shared between pairs of cells. Such sharing in the case of a global metal bit line is described in the above referenced U.S. Pat. No. 5,315,541. It uses a staggered, interlaced segmentation architecture with a transfer network driven by four decode lines per segment pair, thereby allowing each metal bit line to run in the pitch of two cells.

Figure 19:
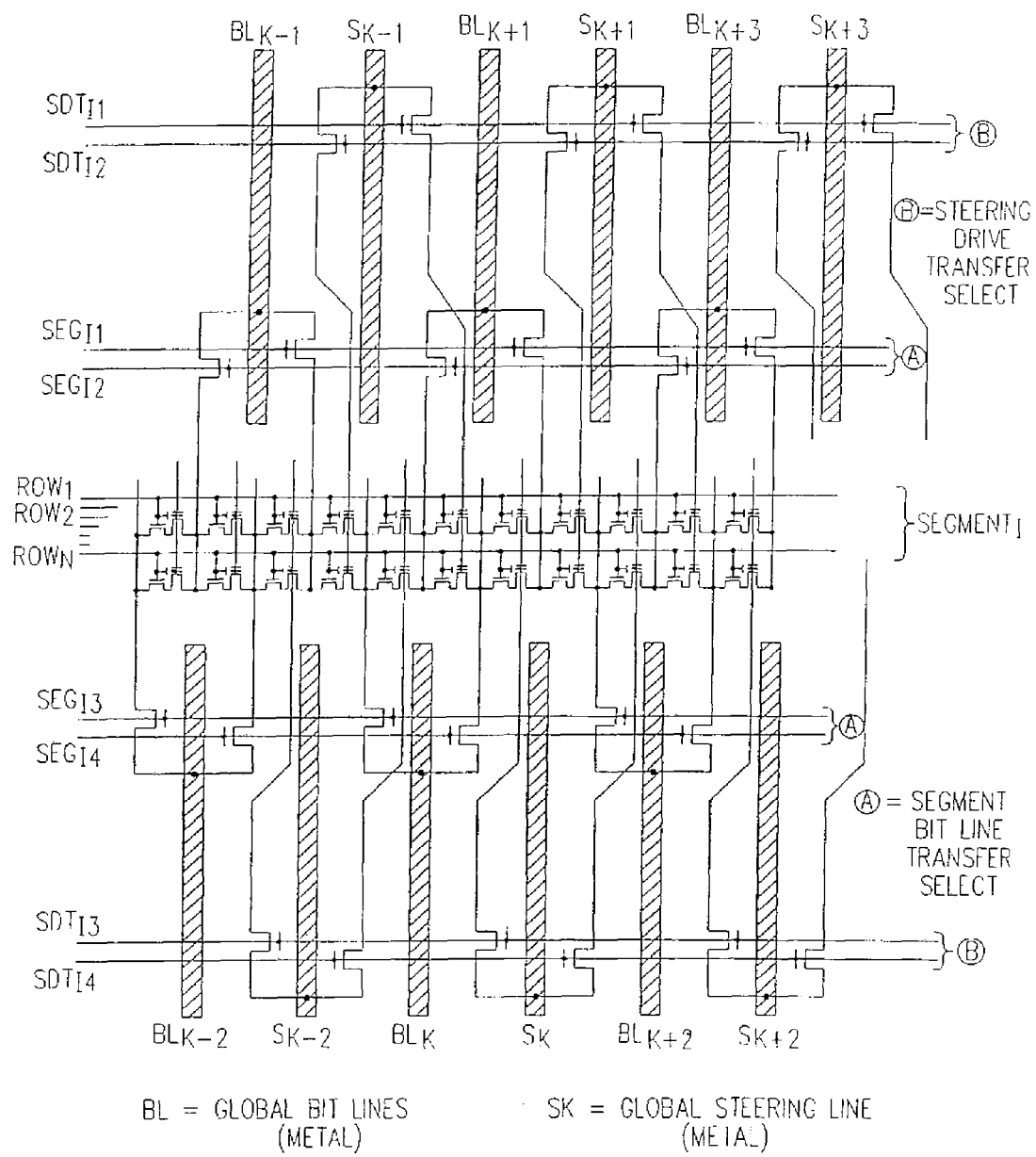
FIG. 19 is a diagram depicting one embodiment of an array suitable for use in accordance with the teachings of this invention.

Similar sharing can also be achieved for the steering lines, an example of which is shown in FIG. 19 (and this is only one of many possible configurations). In this embodiment, there are four steering transfer lines driving the transfer matrix, with one global steering line per two cell columns within the segment. When cells are selected, the steering transfer network connects the corresponding local steering lines to unique global steering lines (e.g. Sk connected via SDTI4)). Each selected global steering line is connected in turn by the chunk select (i.e. column or y-select) circuitry to the CGRE circuitry.

Those steering lines which are not currently active may be floated or held at ground. If grounded, this raises the possibility of having a subset of the local steering lines, associated with a subset of cells which are not being operated on currently, to be held at ground through appropriate enabling of other SDT lines. An example, referring to FIG. 19: Let Sk be the selected global steering line, and SDTI4 be the selected transfer selected line. If it is not desirable to have steering potential applied to unselected cells on the selected row, SDTI3 should be held at ground. However, both SDTI1 and SDTI2 can be turned on allowing the neighboring cells on either side of the selected cell to have grounded steering lines.

The reason that it may be undesirable to have unselected cells on selected rows receive high steering potential comes primarily during programming, when channels are conducting. Even here however, the bias conditions on unselected cells are interchanged vis a vis source and drain, and see lower drain to source potentials, eliminating parasitic programming. Given this, in another embodiment, the four SDT select lines per segment are replaced with a single SDT line, simplifying decoding, and potentially reducing layout area (although because of narrow cell pitch, area reduction is primarily governed by select transistor and vertical interconnect related dictates).

Having floating local steering lines (e.g. in all the unselected segments) does raise issues. It is undesirable that any of these lines drift to or are left at such a high potential that they can promote disturbs. However, with properly designed transfer transistors, which remain solidly cut off when unselected, diffusion leakage will maintain floating steering plates at ground (i.e. at substrate potential). In addition, by making sure that all actively driven steering lines are fully discharged before isolating them, this will insure that all steering lines are close to ground at all times except when actually selected/driven.

In addition to disturbs, large voltages on control gates of unselected cells results in the potential of introducing excessive adjacent cell leakage, impacting proper multi-state setting and sensing. However, this is not an issue for the abovementioned cell embodiment 1 implementation when voltage sensing is used, by virtue of their poly3 select function being independent of the sensing related steering function. This allows the select transistor to be throttled down, (i.e. biased to a minimal turn-on level such as $\leqq 5$ µAmps), with the state-determining conduction occurring when the control gate reaches or exceeds the floating gate transistor's turn-on (or margin) voltage. This select transistor limited current strategy guarantees that, independent of how strongly conducting the floating gate channel may be, parasitic adjacent cell leakage problems are completely eliminated.

Figure 20:
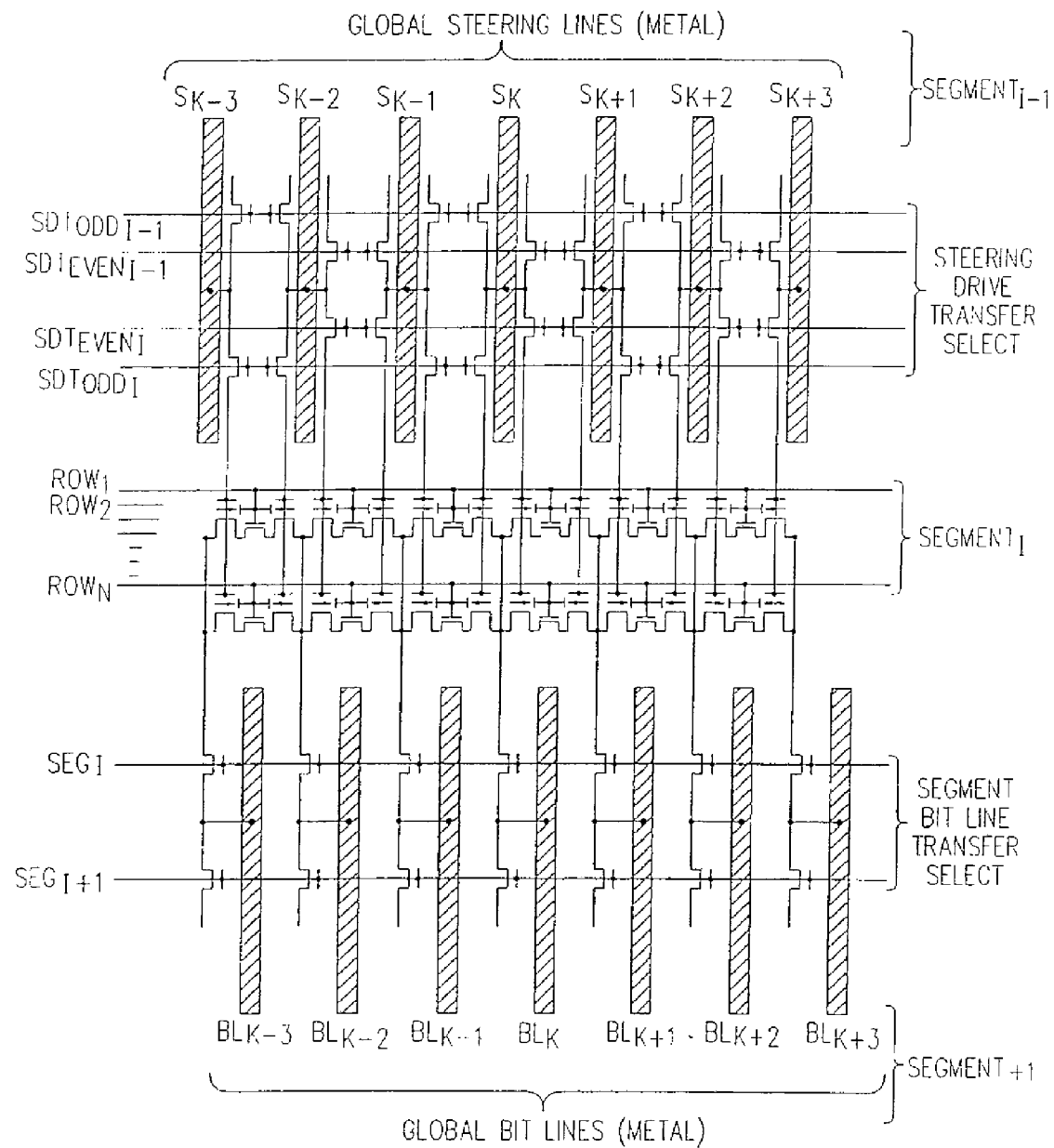
FIG. 20 is a diagram depicting an alternative array suitable for use in conjunction with the present invention.

The same strategy can be applied to the dual floating gate cell embodiment 2, as illustrated in FIG. 20. In this embodiment, the unit memory cell, consisting of two floating gate elements and taking up the pitch of 4*lambda, has associated with it a single bit line diffusion (the other bounding bit line diffusion being associated with the neighboring cell). Therefore, global metal bit lines are naturally reduced to one line per 4*lambda. This also facilitates laying out the segment transistor matrix (e.g. non-interlaced, fully confined segmentation via a one-to-one segment transistor to local BN+ network), and requires only one segment select line per array segment. The steering transfer matrix is driven by two transfer lines per segment, coupled with global (metal) steering lines laid out in the pitch of one line per 4*lambda.

When a transfer line is enabled, it turns on the steering selection transistors for both of the control gates within a cell, for each alternate cell. Each of these two control gates within each of the selected cells are driven by a unique global steering line, which, as in the above described cell embodiment 1 case, are driven, in turn, by the segment select and CGRE circuitry. Also, as in the cell embodiment 1 case, the issue of floating local steering lines exists, with similar resolution.

With either cell embodiment, in order to fully capitalize on speed, it is important to make the chunk size as large as possible, maximizing parallelism. Because of the low cell read and programming currents inherent to both cell embodiment 1 and 1a approaches, peak power is not an issue, nor is adjacent cell leakage, which becomes insignificant. Consequently, the number of floating gates per chunk which can be simultaneously operated on is limited only by segment decode restrictions. With the segmentation approach described, this allows every fourth floating gate to be addressed and operated on, simultaneously, in both cell variants.

In the case of cell embodiment 1, every fourth diffusion is brought to drain potential, and there are three cells under reversed D/S bias conditions between the drain and the next driven ground. Once the first set of cells is completed operation proceeds to the neighboring set. After the fourth such repetition, the full row is completed.

In the dual floating gate embodiment 2 case, wherein every other cell is selected, the biasing approach is different. Two adjacent diffusions are driven to drain potential followed by two adjacent diffusions driven to ground, with that pattern repeated over and over. In this way global D/S bias is applied in mirrored fashion to every other of the selected cells, resulting in floating gate of odd selected cells being the opposite of the even selected cells. Appropriate biases are placed on the global steering lines to satisfy the operation of the targeted floating gates. Once done, the bias conditions for both global bit/gnd lines and targeted/untargeted floating gate steering lines are correspondingly interchanged to act on the other floating gate in the selected cells. Once finished, similar operation is repeated to the alternate set of cells, completing full row programming in 4 passes.

To give an idea of the power of this approach, in a physical row of 1500 floating gate elements, encoded in 8-state (three bits per cell), 375 physical bits or 1125 logical bits are being operated on at one time. Assuming it takes nine pulses to complete programming, this gives a programming rate of 125 logical bits or about 16 bytes per programming pulse, plus similar gains in performance achievable for read. Existing two-state based flash products, by way of comparison, program around 32 bytes per programming pulse, putting the multi-state approach potentially within a factor of two in write speed.

As described above in this portion of this specification, the cell-by-cell column oriented steering approach, realizable in the two source side injection cell embodiments (standard and dual floating gate embodiments), increases the performance of high level multi-state significantly, improving both its write and read speed. It achieves this by applying, in parallel, custom steering conditions needed for the particular state of each cell. This offers substantial reduction in the number of individual programming steps needed for write, and permits powerful binary search methodology for read, without having to carry out full sequential search operations. Improved performance is further bolstered through increased chunk size, made possible here via the low current source-side injection mechanism, which allows every fourth floating gate element to be operated on, thereby increasing chunk size. Although specific examples of array and segmentation architectures have been described, there are a wide variety of alternate options possible which offer similar capabilities.

When combining the above concepts with those previously proposed A to D type sensing approaches, which support the greatest density of multi-state or "logical scaling" within a cell, this offers a powerful approach to achieving cost reduced, performance competitive mass storage memories, appropriate to the Gigabit density generation of products. For example, by achieving effective programming and read rates of about 50% that of two-state operation, this bridges the gap between multi-state and two-state performance substantially, so much so that when the remaining overhead is included (i.e. those portions not directly related to chunk read or programming/verify steps), performance differences from those of two-state can become, for all practical purposes, a non-issue. Combining this with the 8 to 16 multi-level (3 to 4 bits) per cell capability, translates to realizing competitively performing ultra-high density mass storage at a fraction of the cost per Megabyte (from one half to one third), of equivalent binary encoded memory.

Cell Erase Operation—Erase Distribution Tightening

The independent, bit line oriented steering feature described earlier is, in certain embodiments, exploited to significantly tighten an initially wide erased cell population distribution. In a mass storage memory based on the memory cell/array implementations shown in FIGS. 19 and 20, all cells in a sector or group of sectors are erased simultaneously, by applying a sufficiently high positive bias on the poly3 erase electrode relative to the poly2 steering potential. This results in electron tunneling from the poly1 floating gates to the poly3 erase anode(s), as is described in the aforementioned copending U.S. patent application Ser. No. 08/607,951.

An important feature in this embodiment is the capacitive coupling of the combined channel/drain component. It is designed to have a relatively low coupling to the floating gate as compared to the steering element, thereby having only weak impact with respect to the various cell operations, including erase. For example, if the channel potential during erase is the same as that of poly2 (e.g. both at ground), the channel will provide only a slight assist to the steering gate in the erasing operation, resulting in a slightly stronger erase, while if its potential is more positive than that of the steering gate (e.g. the steering gate bias is lowered negatively, for example to about −7v, during erase, with the poly3 erase level lowered the same amount, while the channel potential remains at ground), it will contribute slightly less to erase. Nevertheless, once the poly3 is raised to the erasing potential, the main contributor to erasing a cell is the steering element and its potential.

This strong dependence on steering gate potential provides a direct means for controlling the degree of erase on each cell, individually, in the column oriented steering embodiment. Operation is as follows. At the start of the erase operation, all steering lines are biased at their erase enabling potential (e.g. −7v), and a selected row to be erased (generally this would be one row of a group of rows targeted for erase) is pulsed to a sufficiently positive potential (e.g. 5v) to start the cell erasing process (removing a portion of the electrons from some or all of the floating gates), but which is insufficient to erase any of the cells within that row to the required full erase margin. Once pulsing is completed, the row is biased into a read-at-erase-margins condition, and each cell is checked to see whether it has erased to that margin or not. For any cells which have so erased (as will occur after subsequent erase pulses), their corresponding steering lines will thereafter be biased into a non-erase-enabling or "lock-out" condition (e.g. at 0v) for all subsequent erase pulsing to that row during the remainder of that erasing session. This feature can be accomplished by flipping latches associated with each of the bit/steering line columns. If one or more cells are still not sufficiently erased, the erase pulse is repeated, preferably at an incrementally higher poly3voltage (e.g. 0.5v higher, although increasing time is used in an alternative embodiment), again followed by the read-at-erase-margins operation.

This pulse/checking loop is repeated as necessary until all cells become sufficiently erased (or until some other condition such as maximum voltage, pulses, etc. kicks in, at which time defect management options are invoked), terminating the erase operation to that row. This procedure is then repeated on all the other rows targeted for erase, one row at a time, until all rows/sectors so targeted are erased.

In this way all cells in a sector or group of sectors are both sufficiently erased, and confined to a targeted, tight erase distribution. This capability reduces wear under repeated write cycling, thereby increasing endurance. It is especially useful in speeding up multi-state programming operations following erase, since now time does not have to be expended in bringing heavily overerased cells up to that sufficiently erased condition.

The drawback of this embodiment is that erasing becomes much more time consuming, replacing potentially one single erase pulse applied to all rows (or sectors) simultaneously, with a series of erase pulse/check operations on a row by row basis, since now only a single row can be erased at a time. This approach is most practical when the time associated with erase is hidden, eliminating its impact on write performance. Today there are a number of ways in which mass storage systems eliminate erase related performance loss, including erase ahead approaches and dynamic address mapping via RAM translation tables. In such systems, a tight erase distribution at the start of write can measurably increase write performance, especially with respect to multi-state.

The above discussion assumes that each steering line is uniquely associated with one cell. However, because of layout pitch constraints, especially when implemented in a segmented steering architecture, several cells may share one global steering signal, examples of which are shown in FIGS. 19 and 20, where each pair of cells are associated with one global steering line via steering drive segment transfer select transistors. Following are two embodiments utilizing such sharing.

Figure 21:
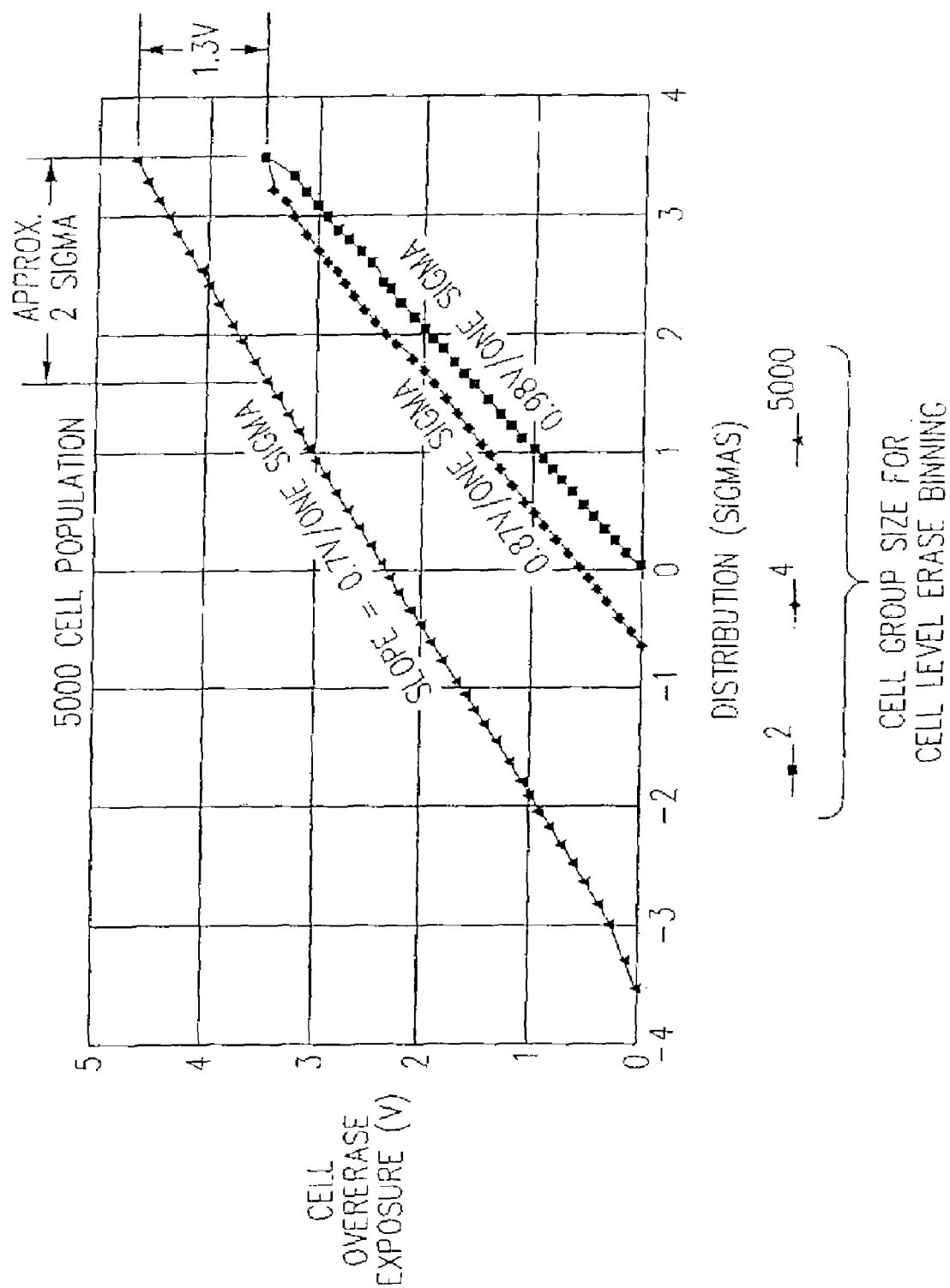
FIG. 21 is a graph depicting the distribution of erased cell levels in accordance with certain embodiments of this invention.

One embodiment allows the sharing to take place in each erase operation, erasing all cells in one row simultaneously, as described above. In this case, however, erase lock-out on a group of cells (or floating gate transistors in the case of dual floating gate cells) sharing a common steering line can only be invoked when all cells in that group have achieved the required erased state margin. This will result in a fraction of the cells becoming overerased as they wait for the weakest cell in each group to achieve sufficient erasure. For example, if each sharing group consists of four cells, in general three cells will become overerased. FIG. 21 models the impact of this sharing approach on a population of 5000 cells, the erase voltages of which follow a normal distribution with a one-sigma of 0.7v. In the case of two-cell sharing, 50% of the cells will have minimal overerase, and the remainder will follow a normal distribution with a one-sigma of about 1v. Comparing this to the original distribution (i.e. without any lockout) shows that with lock-out much fewer cells are subjected to overerasure, at any level of overerase (i.e. they are further up the sigma tail), and the worst case overerase voltage is about 1.3v lower than the original distribution's worst case overerase of about 4.7v. The situation is similar in the case of four-cell sharing, with slightly increased levels of overerase to those of two-cell sharing.

A second embodiment takes advantage of the segment level selection capability, thereby completely avoiding the sharing limitation. Referring specifically to the previously described embodiments, wherein one global steering line is shared by two local steering lines (e.g. FIGS. 19 and 20), the present embodiment exploits the segment steering line addressing capability to only drive one of the two local steering lines in each cell pair (or half the row's worth of cells) during each erase operation. The unaddressed cells' local steering lines are precharged and floated at the non-erase-enabling voltage condition (e.g. 0v). Once the addressed half row's worth of cells are taken through their erase/verify/lockout operations to completion, the steering address is shifted to the other, previously unaddressed cell group halt which are then erased to completion, while the first group of cells are maintained in the non-erase-enabling condition. Although this approach doubles the total erase time compared to using a single erase pulse for the entire row, it will have no impact to write performance in erase-hidden implementations, while it does maintain the desirably tight erase distribution.

In an alternative embodiment, the above controlled over-erase methodology is used to write the multi-state data, with the hot electron programming mechanism relegated to the data unconditional preset operation. While optimum write bias conditions and disturb prevention would depend on specific cell and tunneling characteristics, such a tunneling based write approach is made possible by the fundamental cell array architecture, consisting of the independently controllable column steering feature, plus the bit-by-bit lock-out capability of the above disclosed memory concept relating to FIGS. 19 and 20.

A variety of alternative embodiments of this invention have been taught, which provide improved performance and cost efficiency for multi-state memory devices and systems. The invention now being fully described, it will be apparent to one of ordinary skill in the art that many changes and modifications can be made thereto without departing from the spirit or scope of the appended claims.

All publications and patent applications mentioned in this specification are herein incorporated by reference to the same extent as if each individual publication or patent application was specifically and individually indicated to be incorporated by reference.

What is claimed is:

1. A of concurrently sensing the data content for a plurality of multi-state non-volatile memory cells of a memory array, the method comprising:
    applying a first reference voltage to a control gate of each the plurality memory cells;
    while applying the first reference voltage to the control gate of each the plurality memory cells, receiving the current form each of the plurality of memory cells at a first input of one of a corresponding plurality of sense amplifiers;
    while receiving the current form each of the plurality of memory cells at the plurality of sense amplifies, providing a first reference current at a second input of each of the plurality of sense amplifiers, where the first reference starts at an initial value and incrementally increases;
    for each of the plurality of sense amplifiers, determining when the first reference current exceeds the current from the corresponding one of the memory cells; and
    storing the result of each of said determinings in one of a corresponding plurality of registers.

2. The method of claim 1, further comprising:
    receiving a clock signal, wherein the first reference current is incrementally increased according to the clock signal.

3. The method of claim 2, further comprises:
    maintaining a counter value based on the clock signal and corresponding to the number of increments by which the first reference signal has increased, where the storing the result of each of said determinings is the storing of the corresponding counter value.

4. The method of claim 1, wherein the memory array includes one or more dedicated memory cells, the method further comprising:
    establishing a scale factor for the rate of increase of first reference current based upon the characteristics of the one or more dedicated memory cells.

5. The method of claim 4, wherein the number of dedicated memory cells is one.

6. The method of claim 4, wherein the one or more dedicated memory cells is population of memory cells.

7. The method of claim 4, wherein the one or more dedicated memory cells are in an erased state.

8. The method of claim 1, further comprising:
    subsequent to storing the result of each of said determinings, shifting out the results serially to a controller.

9. the method of claim 1, wherein the non-volatile memory cells each store more than two bits of data.

* * * * *

UNITED STATES PATENT AND TRADEMARK OFFICE
CERTIFICATE OF CORRECTION

| | | |
|---|---|---|
| PATENT NO. | : 7,898,868 B2 | Page 1 of 1 |
| APPLICATION NO. | : 12/499581 | |
| DATED | : March 1, 2011 | |
| INVENTOR(S) | : Guterman et al. | |

It is certified that error appears in the above-identified patent and that said Letters Patent is hereby corrected as shown below:

Column 27, line 29 Claim 1, please delete "A of" and insert -- A method of --.

Column 27, line 36 Claim 1, please delete "form" and insert -- from --.

Column 28, line 1 Claim 1, please delete "form" and insert -- from --.

Signed and Sealed this
Second Day of August, 2011

David J. Kappos
*Director of the United States Patent and Trademark Office*